(12) United States Patent
Hudson et al.

(10) Patent No.: US 11,847,957 B2
(45) Date of Patent: Dec. 19, 2023

(54) BACKPLANE FOR AN ARRAY OF EMISSIVE ELEMENTS

(71) Applicant: GOOGLE LLC, Mountain View, CA (US)

(72) Inventors: Edwin Lyle Hudson, Hsinchu (TW); Bo Li, Santa Clara, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 17/552,158

(22) Filed: Dec. 15, 2021

(65) Prior Publication Data

US 2022/0108651 A1 Apr. 7, 2022

Related U.S. Application Data

(62) Division of application No. 16/914,593, filed on Jun. 29, 2020, now Pat. No. 11,238,782.

(Continued)

(51) Int. Cl.
*G09G 3/32* (2016.01)
*G11C 11/412* (2006.01)

(52) U.S. Cl.
CPC ............ *G09G 3/32* (2013.01); *G11C 11/412* (2013.01); *G09G 2300/0842* (2013.01); *G09G 2310/0297* (2013.01)

(58) Field of Classification Search
CPC ... G09G 3/32–3291; G09G 2310/0297; G09G 2300/0842–0866;

(Continued)

(56) References Cited

U.S. PATENT DOCUMENTS

| 2,403,731 A | 7/1946 | Macneille |
| 3,936,817 A | 2/1976 | Levy et al. |

(Continued)

FOREIGN PATENT DOCUMENTS

| EP | 0658870 A2 | 6/1995 |
| EP | 1187087 A1 | 3/2002 |

(Continued)

OTHER PUBLICATIONS

Hu "Complementary MOS (CMOS) Technology", pp. 198-200, Feb. 13, 2009.

(Continued)

*Primary Examiner* — Roberto W Flores
*Assistant Examiner* — Aaron Midkiff
(74) *Attorney, Agent, or Firm* — Brake Hughes Bellermann LLP

(57) ABSTRACT

A plurality of pixel drive circuits form part of an array of emissive elements. The plurality of pixel drive circuits are disposed to form a plurality of rows and a plurality of columns. The plurality of pixel drive circuits are organized into sets of pixel drive circuits, and each set comprises at least one pixel drive circuit. A FET of a set of pixel drive circuits shares a common well with other FETs of similar function in the same set of pixel drive circuits positioned therein, such that the variance of the threshold voltages of those FETs is substantially reduced. Each of the pixel drive circuits comprises a circuit operative to deliver a current at a predetermined voltage to an emissive device and a memory circuit operative to receive modulation data and to use same to modulate the current output of the pixel drive circuit.

18 Claims, 13 Drawing Sheets

Related U.S. Application Data

(60) Provisional application No. 62/868,054, filed on Jun. 28, 2019.

(58) Field of Classification Search
CPC ....... G09G 2300/08–0895; G11C 11/00–5692; H01L 27/00–3293; H01L 29/00–945; H01L 2924/143–1438; H01L 27/0925–0928; H10B 41/30; H10B 41/70; H10B 41/10; H10K 10/46; H10K 59/121–1213; H10K 59/123
See application file for complete search history.

(56) References Cited

U.S. PATENT DOCUMENTS

| | | | |
|---|---|---|---|
| 4,432,610 A | 2/1984 | Kobayashi et al. |
| 4,825,201 A | 4/1989 | Watanabe et al. |
| 4,923,285 A | 5/1990 | Ogino et al. |
| 4,996,523 A | 2/1991 | Bell et al. |
| 5,018,838 A | 5/1991 | Barnes et al. |
| 5,144,418 A | 9/1992 | Brown et al. |
| 5,157,387 A | 10/1992 | Momose et al. |
| 5,189,406 A | 2/1993 | Humphries et al. |
| 5,317,334 A | 5/1994 | Sano |
| 5,359,342 A | 10/1994 | Nakai et al. |
| 5,471,225 A | 11/1995 | Parks |
| 5,473,338 A | 12/1995 | Prince et al. |
| 5,497,172 A | 3/1996 | Doherty et al. |
| 5,537,128 A | 7/1996 | Keene et al. |
| 5,548,347 A | 8/1996 | Melnik et al. |
| 5,566,010 A | 10/1996 | Ishii et al. |
| 5,602,559 A | 2/1997 | Kimura |
| 5,619,228 A | 4/1997 | Doherty |
| 5,731,802 A | 3/1998 | Aras et al. |
| 5,751,264 A | 5/1998 | Cavallerano et al. |
| 5,767,832 A | 6/1998 | Koyama et al. |
| 5,818,413 A | 10/1998 | Hayashi et al. |
| 5,905,482 A | 5/1999 | Hughes et al. |
| 5,926,158 A | 7/1999 | Yoneda et al. |
| 5,926,162 A | 7/1999 | Wood et al. |
| 5,936,603 A | 8/1999 | Lippmann et al. |
| 5,936,604 A | 8/1999 | Endou |
| 5,945,972 A | 8/1999 | Okumura et al. |
| 5,959,598 A | 9/1999 | Mcknight |
| 5,969,512 A | 10/1999 | Matsuyama |
| 5,969,701 A | 10/1999 | Numao et al. |
| 5,986,640 A | 11/1999 | Baldwin et al. |
| 6,005,558 A | 12/1999 | Hudson et al. |
| 6,034,659 A | 3/2000 | Wald et al. |
| 6,046,716 A | 4/2000 | Mcknight |
| 6,067,065 A | 5/2000 | Worley et al. |
| 6,121,948 A | 9/2000 | Worley et al. |
| 6,127,991 A | 10/2000 | Uehara et al. |
| 6,144,356 A | 11/2000 | Weatherford et al. |
| 6,151,011 A | 11/2000 | Worley et al. |
| RE37,056 E | 2/2001 | Wortel et al. |
| 6,201,521 B1 | 3/2001 | Doherty |
| 6,262,703 B1 | 7/2001 | Perner |
| 6,285,360 B1 | 9/2001 | Li |
| 6,297,788 B1 | 10/2001 | Shigeta et al. |
| 6,317,112 B1 | 11/2001 | Handschy et al. |
| 6,369,782 B2 | 4/2002 | Shigeta |
| 6,424,330 B1 | 7/2002 | Johnson |
| 6,456,267 B1 | 9/2002 | Sato et al. |
| 6,476,792 B2 | 11/2002 | Hattori et al. |
| 6,518,945 B1 | 2/2003 | Pinkham |
| 6,567,138 B1 | 5/2003 | Krusius et al. |
| 6,587,084 B1 | 7/2003 | Alymov et al. |
| 6,603,452 B1 | 8/2003 | Serita |
| 6,621,488 B1 | 9/2003 | Takeuchi et al. |
| 6,690,432 B2 | 2/2004 | Janssen et al. |
| 6,717,561 B1 | 4/2004 | Pfeiffer et al. |
| 6,731,306 B2 | 5/2004 | Booth et al. |
| 6,744,415 B2 | 6/2004 | Waterman et al. |
| 6,762,739 B2 | 7/2004 | Bone |
| 6,784,898 B2 | 8/2004 | Lee et al. |
| 6,788,231 B1 | 9/2004 | Hsueh |
| 6,806,871 B1 | 10/2004 | Yasue |
| 6,831,626 B2 | 12/2004 | Nakamura et al. |
| 6,850,216 B2 | 2/2005 | Akimoto et al. |
| 6,862,012 B1 | 3/2005 | Funakoshi et al. |
| 6,924,824 B2 | 8/2005 | Adachi et al. |
| 6,930,667 B1 | 8/2005 | Iijima et al. |
| 6,930,692 B1 | 8/2005 | Coker et al. |
| 7,066,605 B2 | 6/2006 | Dewald et al. |
| 7,067,853 B2 | 6/2006 | Yao |
| 7,088,325 B2 | 8/2006 | Ishii |
| 7,088,329 B2 | 8/2006 | Hudson |
| 7,129,920 B2 | 10/2006 | Chow |
| 7,187,355 B2 | 3/2007 | Tam et al. |
| 7,379,043 B2 | 5/2008 | Worley et al. |
| 7,397,980 B2 | 7/2008 | Frisken |
| 7,443,374 B2 | 10/2008 | Hudson |
| 7,468,717 B2 | 12/2008 | Hudson |
| 7,692,671 B2 | 4/2010 | Ng |
| 7,852,307 B2 | 12/2010 | Hudson |
| 7,990,353 B2 | 8/2011 | Chow |
| 8,040,311 B2 | 10/2011 | Hudson et al. |
| 8,111,271 B2 | 2/2012 | Hudson et al. |
| 8,264,507 B2 | 9/2012 | Hudson et al. |
| 8,421,828 B2 | 4/2013 | Hudson et al. |
| 8,643,681 B2 | 2/2014 | Endo et al. |
| 9,047,818 B1 | 6/2015 | Day et al. |
| 9,117,746 B1 * | 8/2015 | Clark .................. H01L 29/7816 |
| 9,406,269 B2 | 8/2016 | Lo et al. |
| 9,583,031 B2 | 2/2017 | Hudson et al. |
| 9,824,619 B2 | 11/2017 | Hudson et al. |
| 9,918,053 B2 | 3/2018 | Lo et al. |
| 10,229,630 B2 | 3/2019 | Lau et al. |
| 10,437,402 B1 | 10/2019 | Pan |
| 10,957,272 B2 | 3/2021 | Li et al. |
| 2001/0013844 A1 | 8/2001 | Shigeta |
| 2002/0024481 A1 | 2/2002 | Kawabe et al. |
| 2002/0041266 A1 | 4/2002 | Koyama et al. |
| 2002/0043610 A1 | 4/2002 | Lee et al. |
| 2002/0135309 A1 | 9/2002 | Okuda |
| 2002/0140662 A1 | 10/2002 | Igarashi |
| 2002/0158825 A1 | 10/2002 | Endo et al. |
| 2003/0058195 A1 | 3/2003 | Adachi et al. |
| 2003/0156102 A1 | 8/2003 | Kimura |
| 2003/0174117 A1 | 9/2003 | Crossland et al. |
| 2003/0210257 A1 | 11/2003 | Hudson et al. |
| 2004/0032636 A1 | 2/2004 | Willis |
| 2004/0080482 A1 | 4/2004 | Magendanz et al. |
| 2004/0125090 A1 | 7/2004 | Hudson |
| 2004/0174328 A1 | 9/2004 | Hudson |
| 2005/0001794 A1 | 1/2005 | Nakanishi et al. |
| 2005/0001806 A1 | 1/2005 | Ohmura |
| 2005/0052437 A1 | 3/2005 | Hudson |
| 2005/0057466 A1 | 3/2005 | Sala et al. |
| 2005/0062765 A1 | 3/2005 | Hudson |
| 2005/0088462 A1 | 4/2005 | Borel |
| 2005/0195894 A1 | 9/2005 | Kim et al. |
| 2005/0200300 A1 | 9/2005 | Yumoto |
| 2005/0264586 A1 | 12/2005 | Kim |
| 2006/0012589 A1 | 1/2006 | Hsieh et al. |
| 2006/0012594 A1 | 1/2006 | Worley et al. |
| 2006/0066645 A1 | 3/2006 | Ng |
| 2006/0147146 A1 | 7/2006 | Voigt et al. |
| 2006/0208961 A1 | 9/2006 | Nathan et al. |
| 2006/0284903 A1 | 12/2006 | Ng |
| 2006/0284904 A1 | 12/2006 | Ng |
| 2007/0252855 A1 | 11/2007 | Hudson |
| 2007/0252856 A1 | 11/2007 | Hudson et al. |
| 2008/0007576 A1 | 1/2008 | Ishii et al. |
| 2008/0088613 A1 | 4/2008 | Hudson et al. |
| 2008/0158437 A1 | 7/2008 | Arai et al. |
| 2008/0259019 A1 | 10/2008 | Ng |
| 2009/0027360 A1 | 1/2009 | Kwan et al. |
| 2009/0027364 A1 | 1/2009 | Kwan et al. |
| 2009/0115703 A1 | 5/2009 | Cok |
| 2009/0284671 A1 | 11/2009 | Leister |
| 2009/0303248 A1 | 12/2009 | Ng |
| 2010/0073270 A1 | 3/2010 | Ishii et al. |

(56) References Cited

U.S. PATENT DOCUMENTS

| | | | |
|---|---|---|---|
| 2010/0214646 | A1 | 8/2010 | Sugimoto et al. |
| 2010/0253995 | A1 | 10/2010 | Reichelt |
| 2010/0295836 | A1 | 11/2010 | Matsumoto et al. |
| 2010/0309100 | A1 | 12/2010 | Cok et al. |
| 2011/0109299 | A1 | 5/2011 | Chaji et al. |
| 2011/0109670 | A1 | 5/2011 | Sempel et al. |
| 2011/0199405 | A1 | 8/2011 | Dallas et al. |
| 2011/0205100 | A1 | 8/2011 | Bogaerts |
| 2011/0227887 | A1 | 9/2011 | Dallas et al. |
| 2012/0086733 | A1 | 4/2012 | Hudson et al. |
| 2012/0113167 | A1 | 5/2012 | Margerm et al. |
| 2013/0038585 | A1* | 2/2013 | Kasai .............. G09G 3/3225 438/34 |
| 2013/0308057 | A1 | 11/2013 | Lu et al. |
| 2014/0085426 | A1 | 3/2014 | Leone et al. |
| 2014/0092105 | A1 | 4/2014 | Guttag et al. |
| 2015/0245038 | A1 | 8/2015 | Clatanoff et al. |
| 2016/0203801 | A1 | 7/2016 | De Groot et al. |
| 2016/0365055 | A9 | 12/2016 | Hudson et al. |
| 2018/0061302 | A1 | 3/2018 | Hu et al. |
| 2019/0164982 | A1* | 5/2019 | Lu .................. H10B 41/35 |
| 2019/0347994 | A1* | 11/2019 | Lin .................. G09G 3/32 |
| 2020/0098307 | A1 | 3/2020 | Li et al. |
| 2021/0201771 | A1 | 7/2021 | Li et al. |

FOREIGN PATENT DOCUMENTS

| | | |
|---|---|---|
| GB | 2327798 A | 2/1999 |
| JP | 7049663 A | 2/1995 |
| JP | 2002116741 A | 4/2002 |
| TW | 227005 B | 7/1994 |
| TW | 407253 B | 10/2000 |
| TW | 418380 B | 1/2001 |
| TW | 482991 B | 4/2002 |
| TW | 483282 B | 4/2002 |
| TW | 200603192 A | 1/2006 |
| WO | 0070376 A1 | 11/2000 |
| WO | 0152229 A1 | 7/2001 |
| WO | 2007127849 A2 | 11/2007 |
| WO | 2007127852 A2 | 11/2007 |

OTHER PUBLICATIONS

Ong "Modern MOS Technology: Processes, Devices, and Design" MOS Digital IC Design, 1984, McGaw-Hill Book Company.

Pelgrom et al. "Matching Properties of MOS Transistors", Oct. 1989. IEEE Journal of Solid-State Circuits, vol. 23, No. 5, IEEE.

Wu "Discussion #9 MOSFETs", spring 2008, pp. 1-7, University of California at Berkeley College of Engineering Department of Electrical Engineering and Computer Sciences.

"2114A 1024 x4 Bit Static RAM", Component Data Catalog, Intel Corp., Santa Clara, CA, USA, 1982, 7 pages.

Amon, et al., "PTAT Sensors Based on SJFETs", 10th Mediterranean Electrotechnical Conference, MEleCon, vol. II, 2000, pp. 802-805.

Anderson, et al., "Holographic Data Storage: Science Fiction or Science Fact", Akonia Holographics LLC, presented at Optical Data Storage, 2014, 8 pages.

Armitage, et al., "Introduction to Microdisplays", John Wiley & Sons, 2006, pp. 182-185.

"Sony 3D", screen capture from video clip, 2009, 2 pages.

Baker, "CMOS Circuit Design, Layout, and Simulation", IEEE Press Series on Microelectronic Systems, John Wiley & Sons, Inc., Publication, 2010, pp. 614-616.

Campardo, et al., "VLSI-Design of Non-Volatile Memories", Springer, 2005, pp. 183-188.

Colgan, et al., "On-Chip Metallization Layers for Reflective Light Waves", Journal of Research Development, vol. 42. No. 3/4, May-Jul. 1998, pp. 339-345.

CSE370, "Flip-Flops", Lecture 14, https://studylib.net/doc/18055423/flip-flops, no date, pp. 1-17.

Dai, et al., "Characteristics of LCoS Phase only spatial light modulator and its applications", Optics Communications vol. 238, especially section 3.2, 2004, pp. 269-276.

Drabik, "Optically Interconnected Parallel Processor Arrays", A Thesis, Georgia Institute of Technology, Dec. 1989, pp. 121-126.

Fuller, "Static Random Access Memory—SRAM", Rochester Institute of technology to Microelectronic Engineering, Nov. 18, 2016, pp. 1-39.

Hu, "Complementary MOS (CMOS) Technology", Feb. 13, 2009, pp. 198-200.

Jesacher, et al., "Broadband suppression of the zero diffraction order of an SLM using its extended phase modulation range", Optics Express, vol. 22, No. 14, Jul. 14, 2014, pp. 17590-17599.

Kang, et al., "Digital Driving of TN-LC for WUXGA LCOS Panel", Digest of Technical Papers, Society for Information Display, 2001, pp. 1264-1267.

Nakamura, et al., "Modified drive method for OCB LSD", Proceeding of the International Display Research Conference, Society for Information Display, Campbell, CA, US, 1997, 4 pages.

Ong, "Modern Mos Technology: Processes, Devices, and Design", McGraw-Hill Book Company, 1984, pp. 207-212.

Oton, et al., "Multipoint phase calibration for improved compensation of inherent wavefront distortion in parallel aligned liquid crystal on silicon display", Applied Optics, vol. 46, No. 23, Optical Society of America, 2007, pp. 5667-5679.

Pelgrom, et al., "Matching Properties of MOS Transistors", IEEE Journal of Solid-State Circuits, vol. 23, No. 5, Oct. 1989, 8 pages.

Potter, et al., "Optical correlation using a phase-only liquid crystal over silicon spatial light modulator", SPIE 1564 Opt. Info. Proc. Sys & Arch. III;, 1991, pp. 363-372.

Product Description, "Westar's Microdisplay Inspection System", www.westar.com/mdis, Jan. 2000, 2 pages.

Rabaey, et al., "Digital Integrated Circuits", A Design Perspective, Second Edition, Saurabh Printers Pvt. Ltd, 2016, pp. 138-140.

Rabaey, "The Devices Chapter 3", Jan. 18, 2002, pp. 121-124.

Robinson, et al., "Polarization Engineering for LCD Projection", John Wiley and Sons, Ltd., Chichester, England, 2005, pp. 121-123.

Sloof, et al., "An Improved WXGA LCOS Imager for Single Panel Systems", Proceedings of the Asia Symposium on Information Display, Society for Information Display, Campbell, CA, US, 2004, 4 pages.

SMPTE 274M-2005, "1920 x 1080 Image Sample Structure, Digital Representation and Digital Timing Reference Sequences for Multiple Picture Rates", SMPTE, White Plains, New York, US, 2005, 29 pages.

Underwood, et al., "Evaluation of an nMOS VLSI array for an adaptive liquid-crystal spatial light modulator", IEEE Proc, v. 133 PI.J. No., Feb. 1986, 15 pages.

Wang, "Studies of Liquid Crystal Response Time", University of Central Florida, Doctoral Dissertation, 2005, 128 pages.

Wu, "Discussion #9 MOSFETs", University of California at Berkeley College of Engineering Department of Electrical Engineering and Computer Sciences, Spring 2008, pp. 1-7.

\* cited by examiner

BACKPLANE FOR AN ARRAY OF EMISSIVE ELEMENTS

CROSS-REFERENCE TO RELATED APPLICATIONS

This application is a division of U.S. patent application Ser. No. 16/914,593, filed on Jun. 29, 2020, which claims the benefit of U.S. Provisional Patent Application Ser. No. 62/868,054, filed on Jun. 28, 2019.

FIELD OF THE INVENTION

The present invention relates to the design of a backplane useful to drive an array of pixels comprising emissive elements at each pixel and to an emissive array fabricated with such a backplane. More particularly, the present invention relates to a backplane designed such that it can drive an array of micro emissive pixel elements with high current.

BACKGROUND OF THE INVENTION

Emissive displays have proved useful for a variety of applications. For example, plasma display panels (PDPs) were at one time the leading flat panel display technology. More recently, applications that are not display oriented have been postulated, including use as a pixilated emissive device in an additive manufacturing device and use as a component within a vehicular illumination system for automotive applications.

More recently, emissive display system developers have demonstrated emissive displays based on backplanes driving small LEDs with a pitch between adjacent pixels of 17 micrometers (hereafter microns or µm) or less. For applications requiring higher brightness the small LEDs may be made larger although still small—on the order of 40 to 50 microns. The sizes stated are not limiting on this specification. These small LEDs are commonly termed microLEDs or µLEDs. LEDs take advantage of the band gap characteristic of semiconductors in which use of a suitable voltage to drive the LED will cause electrons within the LED to combine with electron holes, resulting in the release of energy in the form of photons, a feature referred to as electroluminescence. Those of skill in the art will recognize that semiconductors suitable for LED components may include trace amounts of dopant material to facilitate the formation of electron holes. Organic light emitting diodes or OLEDs are another example of a class of emissive devices.

The choice of semiconductor materials to form an LED will vary by application. In some applications for visual displays one monochrome color may be desirable, resulting in the use of a single semiconductor material for the LEDs of all pixels. Some LEDs provide white light by using blue light to illuminate a phosphor material suitable to provide green and red light, which, combined with the blue light, is perceived as white in color. In other applications, a full range of colors may be required, which will result in a requirement for three or more semiconductor materials configured to radiate, for example, red, green and blue or combinations thereof. An illumination system based on LEDs may be applied to use in a variety of applications, including motor vehicle lights and head lamps. In the case of additive manufacturing, a semiconductor material may be selected such that it emits radiation at a wavelength that acts as actinic radiation on a material used in an additive manufacturing process. All potential variations are included within the scope of the present invention.

SUMMARY OF THE PRESENT INVENTION

The present invention pertains to a backplane comprising pixel drive circuits operative to deliver a modulated high current to a plurality of emissive elements mounted thereon. More particularly, it pertains to a backplane suitable for use as part of a headlamp illumination system that provides selection mechanisms that enable selection of best brightness matches among the plurality of emissive elements.

DETAILED DESCRIPTION OF THE INVENTION

Figure 1A:
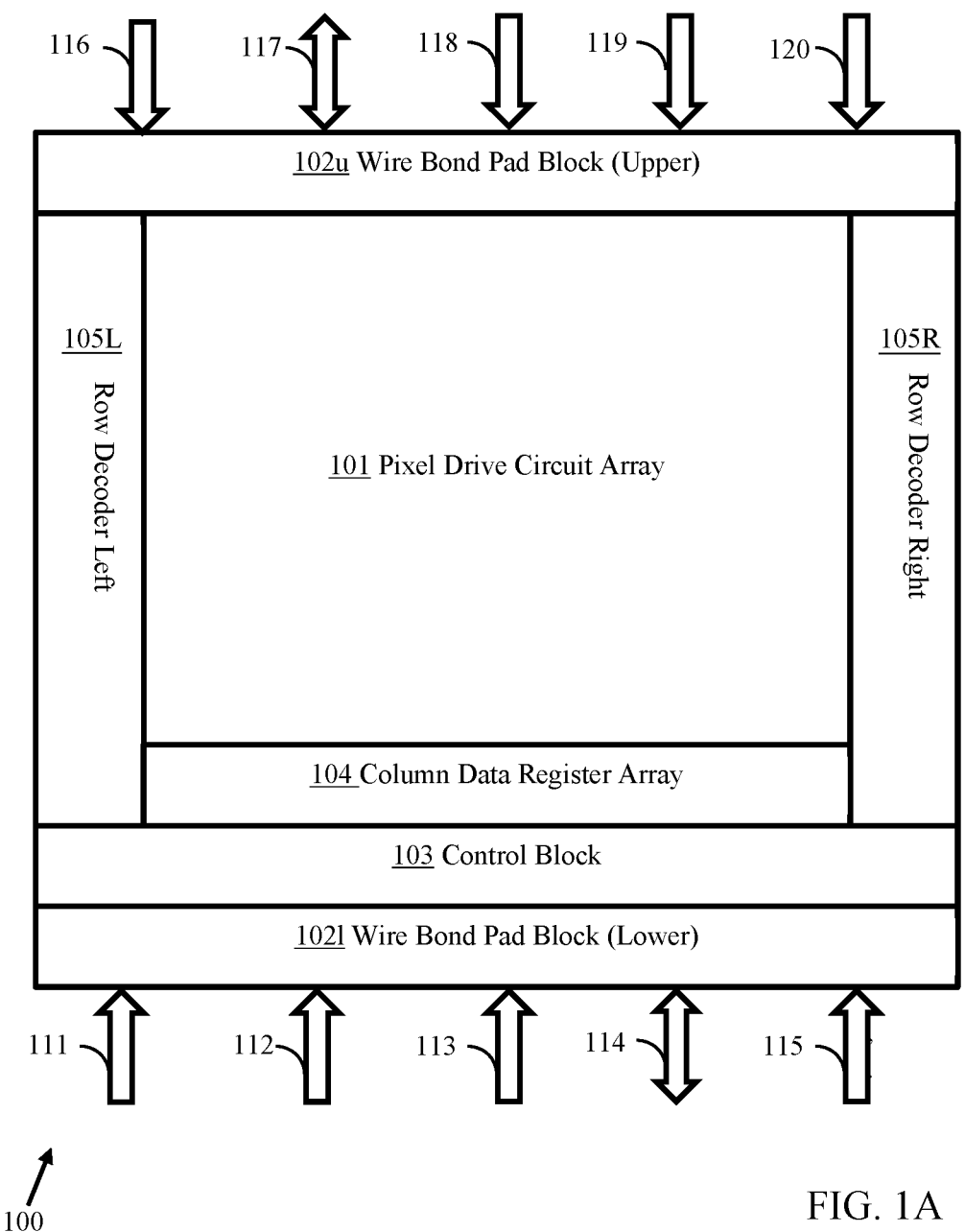
FIG. 1A presents a block diagram of a backplane suitable to drive an array of emissive elements.

One aspect of the present invention is the use of multiple current sources in parallel that are duplicates of the FET used to generate the reference current to create a higher current output. The parallel current sources must have similar threshold voltages. Another aspect of the present invention is a need to provide high current to an array of high brightness emissive elements. This requires the use of a complex current mirror circuit with many parallel current sources each replicating a reference current circuit.

Because the high current can lead to excessive heating if the resistance of the current sources is high, one object of the present invention is to realize the reference current device and the current source devices in as low a resistance configuration as feasible. Joule heating in a device is calculated as the product of the square of the current multiplied by the resistance. A way to achieve low resistance is to design the devices as large W, short L FETs. The limitation of this approach is that matching the performance characteristics of such devices, such as threshold voltage $V_T$ or $V_{TH}$, is challenging. An alternative reference for threshold voltage is $V_{GS(TH)}$, which is the voltage at which the gate voltage will turn on the FET to a degree. $V_{GS}$ is the voltage difference between the source voltage and the gate voltage. The present invention includes design mechanisms to control the impact of variation between devices by designing a number of features into the complex current mirror circuit to facilitate current averaging in the complex current mirror circuit.

One additional feature of the present invention is a set of at least one additional current mirror circuit parallel to the one mentioned above that can be switched in or out through an external command as needed to improve the circuit averaging outcome. In one embodiment, the additional reference current circuit is wired in parallel to the first reference current circuit and the additional current source circuit is wired in parallel to the first current source circuit such that all reference current circuits supply current to all current source circuits.

These and other objects and advantages of the present invention will no doubt become obvious to those of ordinary skill in the art after having read the following detailed description of the preferred embodiments, which is illustrated in the various drawing figures.

In the present application, the preceding general description and the following specific description are exemplary and explanatory only and are not restrictive of the invention as claimed. It should be noted that, as used in the specification and the appended claims, the singular forms "a", "an" and "the" include plural referents unless the context clearly dictates otherwise. Thus, for examples, reference to a material may include mixtures of materials; reference to a display may include multiple display, and the like. Use of the word display is synonymous with the term array of pixels as well as other similar terms. A display need not be used as a means for presenting information for human viewing and may include an array of pixels for any use. All references cited herein are hereby incorporated by reference in their entirety, except to the extent that they conflict with teachings explicitly set forth in this specification. The terms MOSFET transistor, FET transistor, FET and transistor are considered to be equivalent. All transistors described herein are MOSFET transistors unless otherwise indicated. Those of skill in the art will recognize that equivalent circuits may be created in nMOS silicon or pMOS silicon.

The present application deals with binary data used for pulse width modulation. Although common practice is to use the number 1 to indicate an on state and the number 0 to indicate an off state, this convention is arbitrary and may be reversed, as is well known in the art. Similarly, the use of the terms high and low to indicate on or off is arbitrary and, in the area of circuit design, misleading, because p-channel FET transistors are in a conducting state (on) when the gate voltage is low and in a nonconducting state (off) when the gate voltage is high. The use of the word binary means that the data represents one of two states. Commonly the two states are referred to as on or off. It does not mean that the duration in time of binary elements of data is also binary weighted. In emissive displays as those of the present invention, it is often possible for a pixel of the emissive display to achieve an off state that is truly off, in that no noticeable residual leakage of light from that pixel occurs when the data state of the circuit driving a pixel of the emissive device is placed to off.

The term conductor shall mean a conductive material, such as copper, aluminum, or polysilicon, operative to carry a modulated or unmodulated voltage or signal. The word wire shall have the same meaning as the term conductor. The word terminal shall mean a connection point to a circuit element. A terminal may be a conductor or a node or other construct. Conductors shall be represented by solid lines unless otherwise indicated. Lines that cross one another are not considered to be electrically connected unless there is a solid connection dot placed over the intersection.

The present application makes use of current mirror circuits, the simplest forms of which are well known in the art. A minimal current mirror circuit comprises two p-channel FETs that may be duplicates of each other and one n-channel FET that biases the current to a required voltage level. The terminology describing the components of a current mirror circuit is not consistent across various documents. In the present application, the device generating the reference current to be cloned is called a reference current FET and the current it generates is the reference current or $I_{REF}$. The device that sets the voltage level of the reference current is the bias FET and the voltage level it sets is the reference voltage or $V_{REF}$. Thus the reference is current $I_{REF}$ at potential $V_{REF}$. The device that receives the reference current at the reference voltage is the current source FET. Its output is termed the output current with appropriate qualifiers.

FIG. 1A presents a diagram of the data transfer sections and selected external interfaces of spatial light modulator (SLM) 100. SLM 100 comprises pixel drive circuit array 101, left row decoder 105L, right row decoder 105R, column data register array 104, control block 103, and wire bond pad blocks 102l (lower) and 102u (upper.) Wire bond pad block 102l is configured so as to enable contact with an FPCA or other suitable connecting means so as to receive data and control signals over lines from an SLM controller such as that of FIG. 1B. The data and control signal lines for lower wire bond pad block 102l comprise clock signal line 111, op code signal lines 112, serial input-output signal lines 113, bidirectional temperature signal lines 114, and parallel data signal lines 115. The selected interfaces for upper wire bond pad block 102u comprise circuit voltages V_H 116, emissive pixel current mirror selection signal pads 117 and 118, rail voltages $V_{DDAR}$ and $V_{SS}$ pad 119 and common cathode return (V_Low) 120. The total number of wire bond pads may easily exceed 100 separate pads and may reach several hundred pads. Some voltage supply pads, such as pads for $V_{SS}$ or $V_{DDAR}$, may be present in multiple instances.

Wire bond pad block 102l receives connections for emissive pixel state data and control signals and moves these signals to control block 103. Control block 103 receives the emissive pixel state data and routes the data to column data register array 104. Row address information is routed to row decoder left 105L and to row decoder right 105R. In one embodiment, the value of Op Code line 112 determines whether data received on parallel data signal lines 115 is address information indicating the row to which data is to be loaded or data to be loaded to a row. In one embodiment the row address information acts as header, appearing first in a time ordered sequence, to be followed by data for that row. In the context of the present application, the word "address" is most often a noun used to convey the location of the row to be written. The location may be conveyed as an offset from the location (address) of a baseline row or it may be an absolute location of the row to be written. This is similar to the manner in which a Random-Access Memory device, such as an SRAM, is written or read. The use of column addressing, also used in Random-Access Memory devices, may be envisioned, but other mechanisms, such as a shift register, are also envisioned. Use of a shift register to enable the writing of data to rows of the array is also envisioned.

Row decoder left 105L and row decoder right 105R are configured to pull the word line for the decoded row high so that data for that row may be transferred from bit line driver elements forming column data register array 104 to the storage elements resident in the pixel cells of that row of pixel array 251. In one embodiment, row decoder left 105L pulls the word line high for a left half of the display, and row decoder right 105R pulls the word line high for a right half of the display.

The depiction of left and right side row decoder circuits and upper and lower wire bond pad circuits is purely for ease of reference and is not limiting upon the present invention.

Figure 1B:
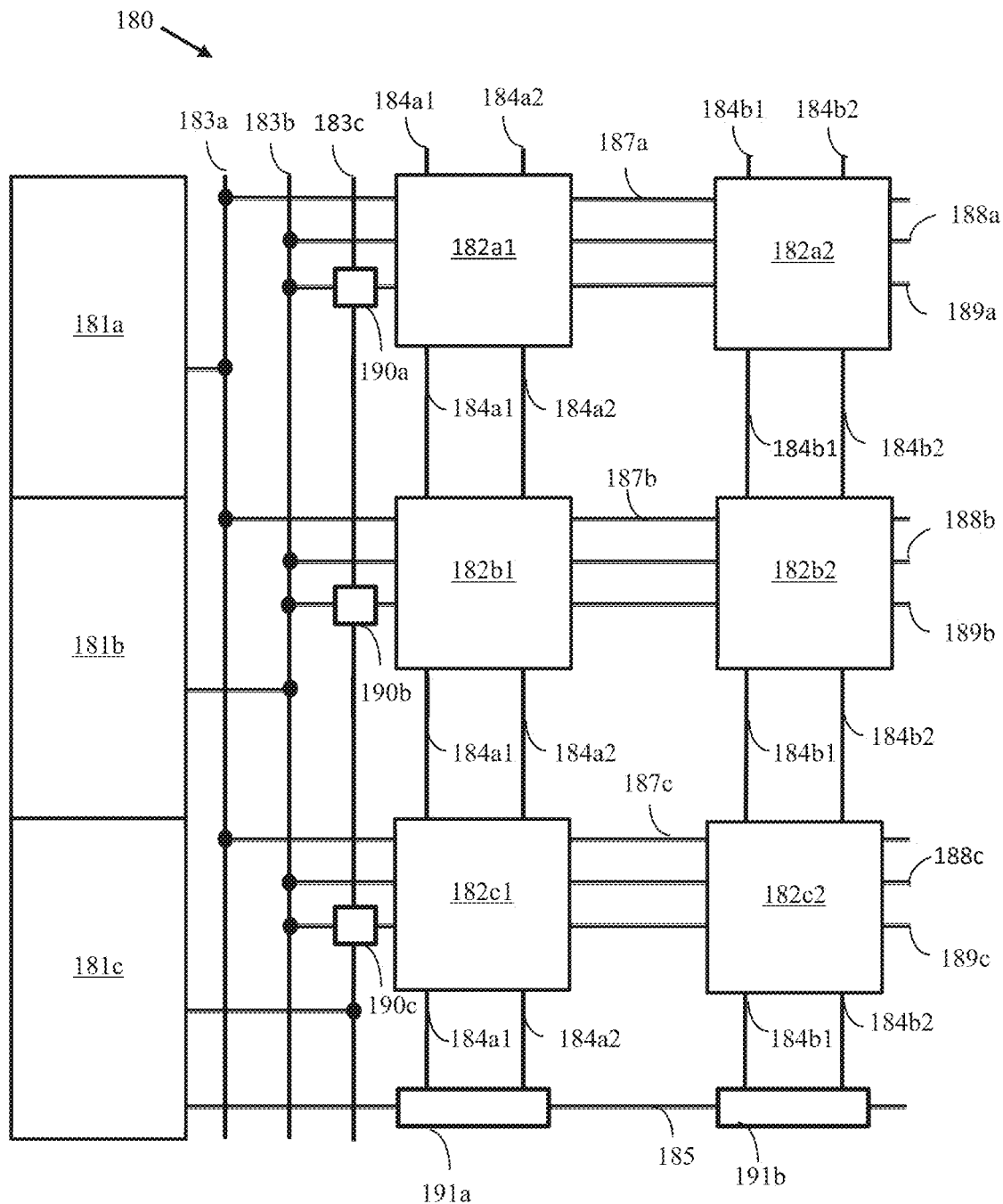
FIG. 1B presents a block diagram of a controller and backplane suitable to drive an array of emissive elements.

FIG. 1B depicts a simplified diagram 180 of display controller interfaces with an array of pixel circuits. A display controller comprises static voltage section 181a, signal voltage control section 181b and data memory and logic control section 181c. A first row of pixel circuits comprises pixel 182a1 and pixel circuit 182a2. A second row of pixel circuits comprises pixel circuit 182b1 and pixel circuit 182b2. A third row of pixel circuits comprises pixel circuit 182c1 and pixel circuit 182c2. A first column of pixel circuits comprises pixel circuit 182a1, pixel circuit 182b1 and pixel circuit 182c1. A second column of pixel circuits comprises pixel circuit 182a2, pixel circuit 182b2 and pixel circuit 182c2. The choice of this number of pixel circuits in FIG. 1B is for ease of reference and is not limiting upon this disclosure. Arrays of pixel circuits comprising in excess of 1000 rows and 1000 columns are commonplace in products for both display purposes and non-display purposes.

Static voltage section 181a provides a set of voltages required to operate the array of pixel circuits, said voltages comprising $V_{DDAR}$, $V_{SS}$, upper drive voltage V_H and cathode return voltage V_L loaded onto static voltage distribution bus 183a. Static voltage distribution bus 183a distributes $V_{DDAR}$, V_H, $V_{SS}$ and V_L to the pixel circuits of a first row over conductor 187a, to the pixel circuits of a second row over conductor 187b and to the pixel circuits of a third row over conductor 187c, wherein each of conductors 187a, 187b and 187c comprises at least one separate conductor for each supplied static voltage.

Signal voltage control section 181b delivers control signals required to operate the array of pixels, such as word line (WLINE) high for the selected row, over bus 183b. Signal voltage control 181b delivers signals to signal voltage distribution bus 183b, which in turn delivers the signals to the pixels of a first row over conductor 188a, to the pixels of a second row over conductor 288b and to the pixels of a third row over conductor 188c. Conductors 188a, 188b and 188c each may comprise a plurality of conductors such that each control signal is delivered independently of other control signals. The row on which WLINE is to be held high is selected by a row decoder circuit (not shown) Timing of the signal voltages and their application to the circuit are typically controlled by an executive function such as data memory and logic control section 181c. The word line for the selected row is one of conductor 189a, conductor 189b or conductor 189c, as determined by the state of each row decoder set by data memory and logic control section 281c.

Data memory and logic control section 181c performs several functions. It may, for example, process modulation data received in a standard 8-bit or 12-bit format into a form usable to pulse-width modulate a display. A first function is to select a row for data to be written to and a second function is to load the data to be written to that row. Data memory and logic control section 181c loads image data onto column (bit line) drivers 191a and 191b over bus 185. Conductors 184a1 and 184a2 represent a first pair of complementary bit lines that route data to the first column. Conductors 184b1 and 184b2 represent a second pair of complementary bit lines that route data to the second column. Each of said pair of complementary bit lines are operative to transfer data from column drivers 191a or 191b respectively to the memory cell of each pixel of the selected row. Data memory and logic control section 181c loads the selected address information onto address data bus 183c, which acts to select the correct row using row decoder circuit 190a, row decoder circuit 190b and row decoder circuit 190c each positioned on address data bus 183c. When WLINE for the selected row is held high, the data on the bit line drivers are loaded into the memory cell of each pixel of the selected row.

Column (bit line) drivers 191a and 191b may each comprise a tri-state buffer and a memory cell, wherein the memory cell asserts its output onto the tri-state buffer. The tri-state buffer further comprises an enable terminal and an output. When a signal is received from data memory and logic control section on the enable terminal, the value asserted on the input of the tri-state memory cell is then asserted onto its output. This provides a measure of control over the loading of data onto the bit lines.

One additional function to be managed by data memory and logic control section 181c is the operation of one or more current mirror circuit configuration lines operative to change the configuration of components within each of the pixels. In one embodiment, the configuration lines are global signals affecting all of the pixel circuits of the array of emissive elements at substantially the same time. In one embodiment, the configuration lines are semi-global, affecting all pixels of a portion of the array.

Figure 2A:
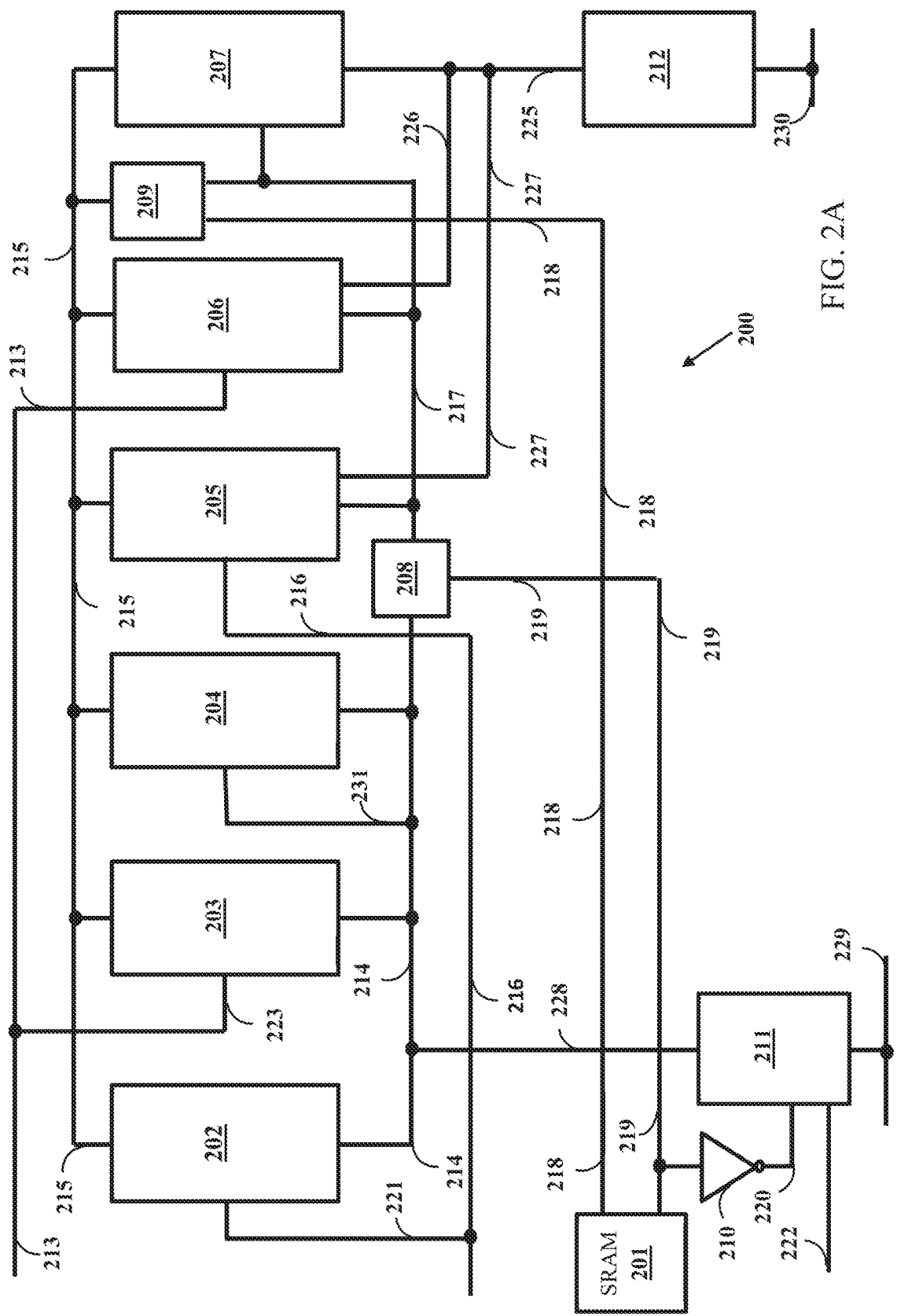
FIG. 2A presents a block diagram of an emissive pixel driver element that provides alternative current mirror selection options.

FIG. 2A presents a block diagram of a pixel drive element 200 of an array of emissive elements after the present invention. Drive element 200 comprises SRAM 201, selectable reference current FETs 202 and 203, non-selectable reference current FET 204, selectable current source FETs 205 and 206, non-selectable current source FET 207 and large L n-channel voltage bias FET assembly 211, operative to drive LED 212.

Bus 215 is biased to voltage V_H, which connects to selectable reference current FETs 202 and 203, non-selectable reference current FET 204, selectable current source FETs 205 and 206 and non-selectable current source FET 207. Bus 214 is biased to $V_{REF}$ by large L n-channel FET assembly 211 at a level determined by global signal $V_{BIAS}$ asserted onto the gate of large L n-channel FET assembly 211 over terminal 222. Bus 217 is biased by bus 214 to a value equal to $V_{REF}$ minus the small threshold voltage of switch FET 208.

Selection signal Config1 is asserted onto control line 213, routed to selectable reference current circuit 203 over conductor 223, and to selectable current source circuit 206, and selection signal Config2 is asserted over control line 216, routed to selectable reference current circuit 202 over conductor 221 and to selectable current source circuit 205.

Selections signal Config1 and Config2 may each be operated independently of the other. In one embodiment, when selection signal Config1 or Config2 is high, the current reference circuit and current source circuit associated with the selection signal that is high are configured to mirror current onto the output of the circuit associated with that selection signal. When selection signal Config1 or Config2 is low, the reference current circuit and current source circuit associated with the selection signal that is low are configured not to mirror current onto the output of the current source FETs associated with that selection signal.

Non-selectable current reference FET 204 is configured to an always on configuration. The gate of non-selectable reference current FET 204 connects to $V_{REF}$ bus 214 over conductor 231, thereby placing FET 204 in diode mode in all cases where $V_{REF}$ is asserted onto bus 214.

In a principal embodiment, selectable reference current FETs 202 and 203 and non-selectable reference current FET 204 are identical FETs, and each current FET found in selectable current source FETs 205 and 206 and in non-selectable current FET 207 are identical to the reference current FETs found in reference current FETs 202, 203 and 204. In the same embodiment, the FET configurations of current source FETs 205, 206 and 207 are identical. In one embodiments, each of current source FET 205, 206 and 207 are comprised of a like number of FETs identical to the FETs of reference current FETs 202, 203 and 204.

The need for the previously identified selectable reference current/current source FETs in the current mirror components of pixel drive element 200 is to provide a selectable level of backup in the event that the pixel circuit elements are not sufficiently matched in performance; i.e., if the level of mismatch is high enough to render a number of pixel drive elements unusable or excessively weak or bright.

Because the selectable reference current/current source FETs are separately wired parallel to the non-selectable FETs, the overall width ratio of the current reference FETs to current source FETs is unchanged and so the level of current provided is unchanged regardless of the selection state.

Modulation FET 209 is a p-channel switch FET configured to modulate the output of non-selectable current source FET 207 and to modulate the outputs of selectable current source FETs 205 and 206 (when those FETs are selected) in conjunction with p-channel bus switch FET 208.

SRAM 201 comprises complementary outputs $S_{POS}$ and $S_{NEG}$ asserted on conductors 218 and 219. Through its outputs, SRAM 201 controls three different components of pixel drive element 200. The output asserted on conductor 218 is termed $S_{POS}$ and the output asserted on conductor 219 is termed $S_{NEG}$. This is a commonly used convention for the two output terminals of an SRAM. When signal $S_{POS}$ is high, it places p-channel modulation FET 209 in an off state. When signal $S_{POS}$ is high, signal $S_{NEG}$ is necessarily low, which places p-channel bus switch FET 208 is an on state. When $S_{POS}$ is low and signal $S_{NEG}$ is high, the reverse is true. Thus modulation FET 209 and switch FET 208 are never both conducting in an on state at the same time. As will be shown, when modulation FET 209 is in an off state, current source FET 207 is able to release output current onto its output.

Modulation is accomplished through a series of states in which the individual emissive elements switch between states in which the emissive element is emitting light and states in which the emissive element is not emitting light. The data state of SRAM memory cell 201 determines if associated emissive element 212 is on or off. When $S_{POS}$ is high, modulation FET 209 is off and bus switch FET 208 is on. When bus switch FET 208 is on, $V_{REF}$ is effectively asserted onto bus 217. This asserts $V_{REF}$ onto the gate of non-selectable current source FET 207. Additionally, it asserts $V_{REF}$ onto any of the selectable current source FETs 205 and 206 that are selected on by Config1 or Config2. When $S_{POS}$ is low, $V_{REF}$ is effectively removed because bus switch FET 208 is turned off. Additionally, modulation FET 209 connects bus 217 to V_H, which places V_H on the gate of current source FET 207, effectively taking it out of saturation, thereby causing current source FET 207 to cease functioning as a current source. If either of selectable current source FETs 205 or 206 is selected on, V_H is asserted to it and no current is generated by that FET. These two switch steps create a highly effective modulation scheme.

The third component controlled by SRAM 201 is large L n-channel FET assembly 211 operative to act as a reference voltage bias FET. A second component in assembly 211 is an n-channel switch FET placed between the large L n-channel FET and ground line 229 (biased to $V_{SS}$ or ground.) When $S_{NEG}$ is low, inverter 210 asserts a high signal onto the gate of the n-channel switch FET over conductor 220, which completes the connection of ground line 229 to the large L n-channel FET that forms part of assembly. This enables assembly 211 to provide $V_{REF}$ over conductor 228 to bus 214. When $S_{NEG}$ is high, inverter 210 asserts a low signal onto the gate of the n-channel switch FET of conductor 220, which breaks the connection between ground line 229 to the large L n-channel FET of assembly 211.

The purpose of this action is to control heating within the pixel cells in an off state by reducing current flows that do not result in emitted light. This is expected to work well in non-imaging applications such as automotive headlamps provided the duty cycle of each pixel is relatively low. High duty cycle applications, such as high emission displays may suffer from data dependent variations in emissions, which is normally to be avoided.

The current output of selectable current source FET 205 is asserted onto conductor 227. The current output selectable current source FET 206 is asserted onto conductor 226. The output of non-selectable current source FET 207 is asserted onto conductor 225. Conductors 226 and 227 connect to conductor 225, which in turn connects to the anode of emissive element (LED) 212. This insures that all current sources operate in parallel and that all mirrored current is all delivered to the LED. The cathode of emissive element 212 is connected to bus 230, which is biased on V_L. In one embodiment, all cathodes are biased to a common voltage in a common cathode arrangement. In one embodiment, the common cathode V_L is equal to $V_{SS}$.

Figure 2B:
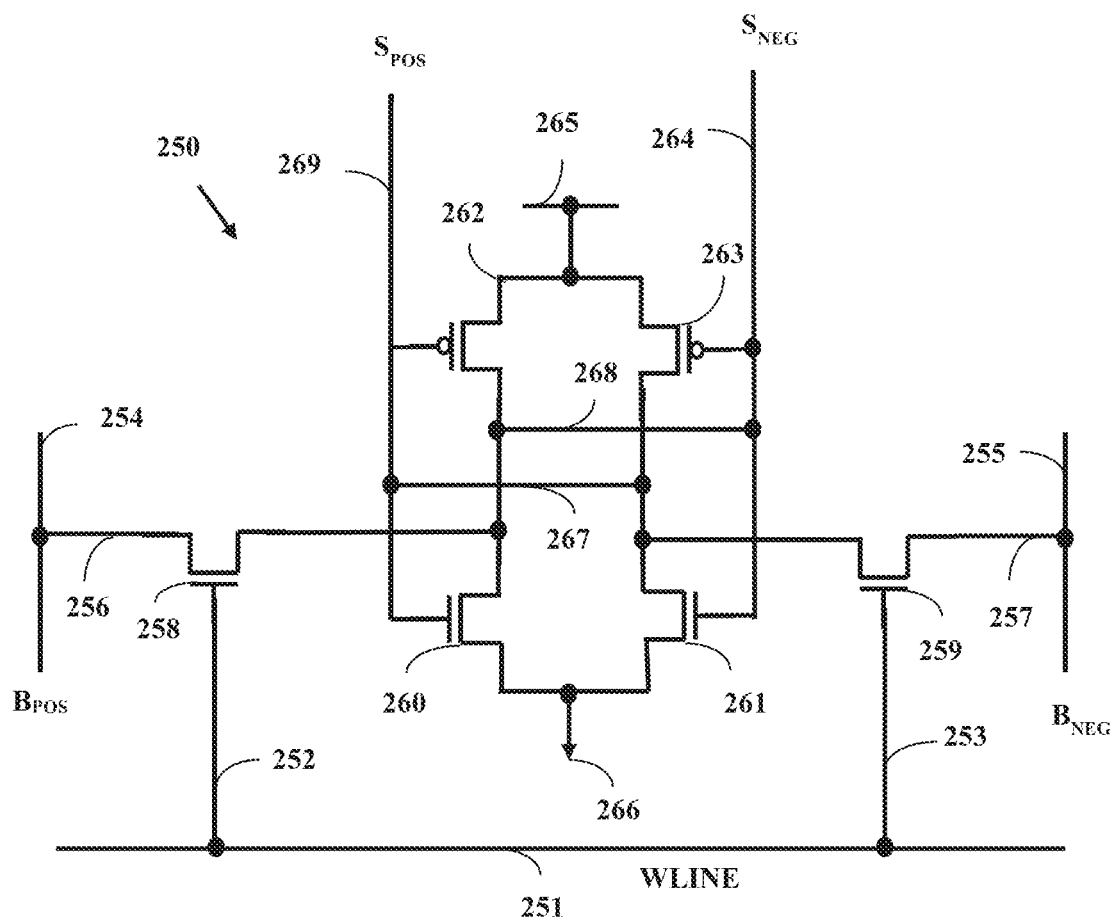
FIG. 2B presents a schematic circuit diagram of a 6-transistor SRAM cell configured to act as a component of an emissive pixel driver element.
Figure 2C:
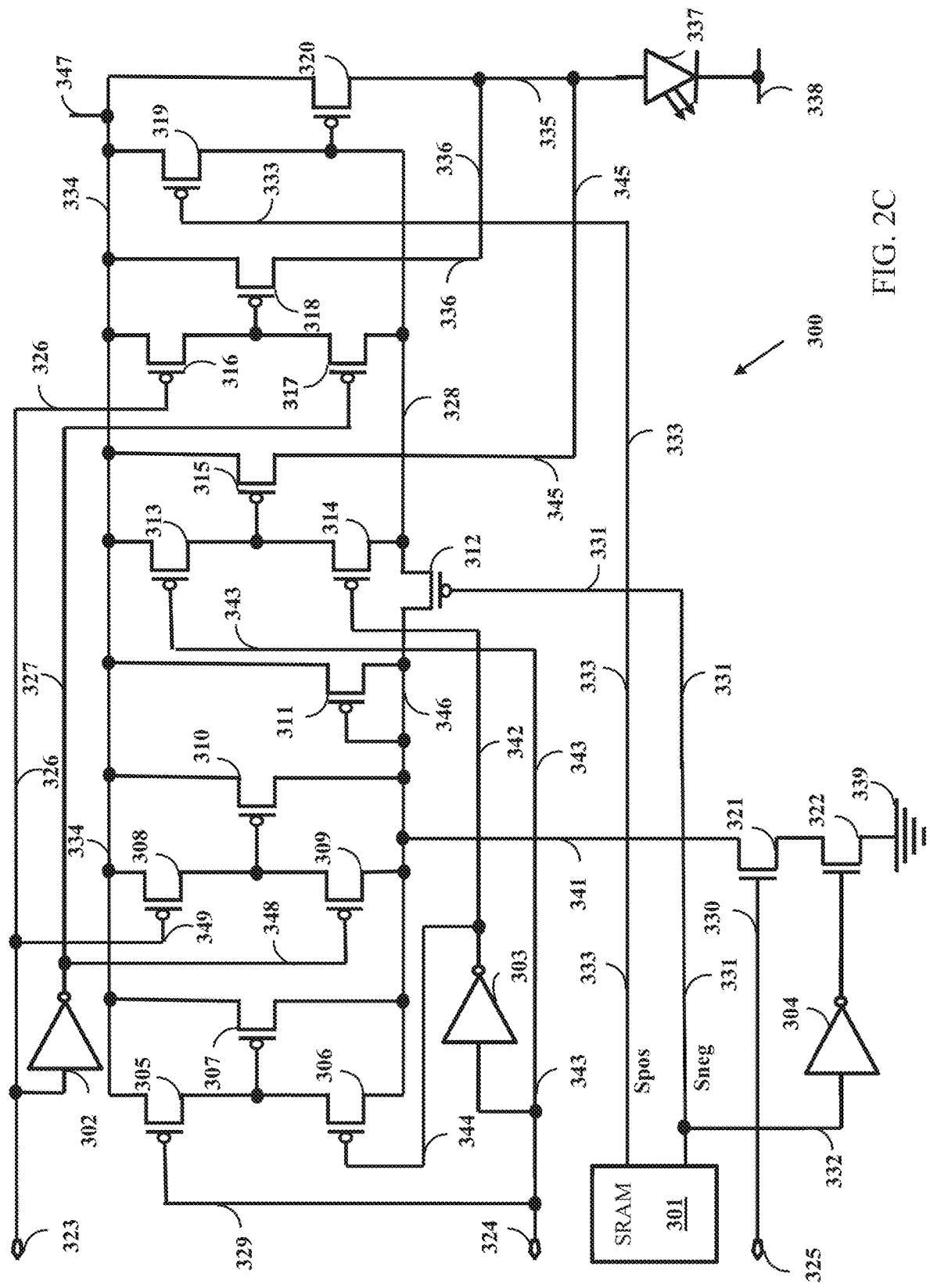
FIG. 2C presents a schematic circuit diagram of an emissive pixel drive circuit that provides alternative current mirror options.
Figure 2D:
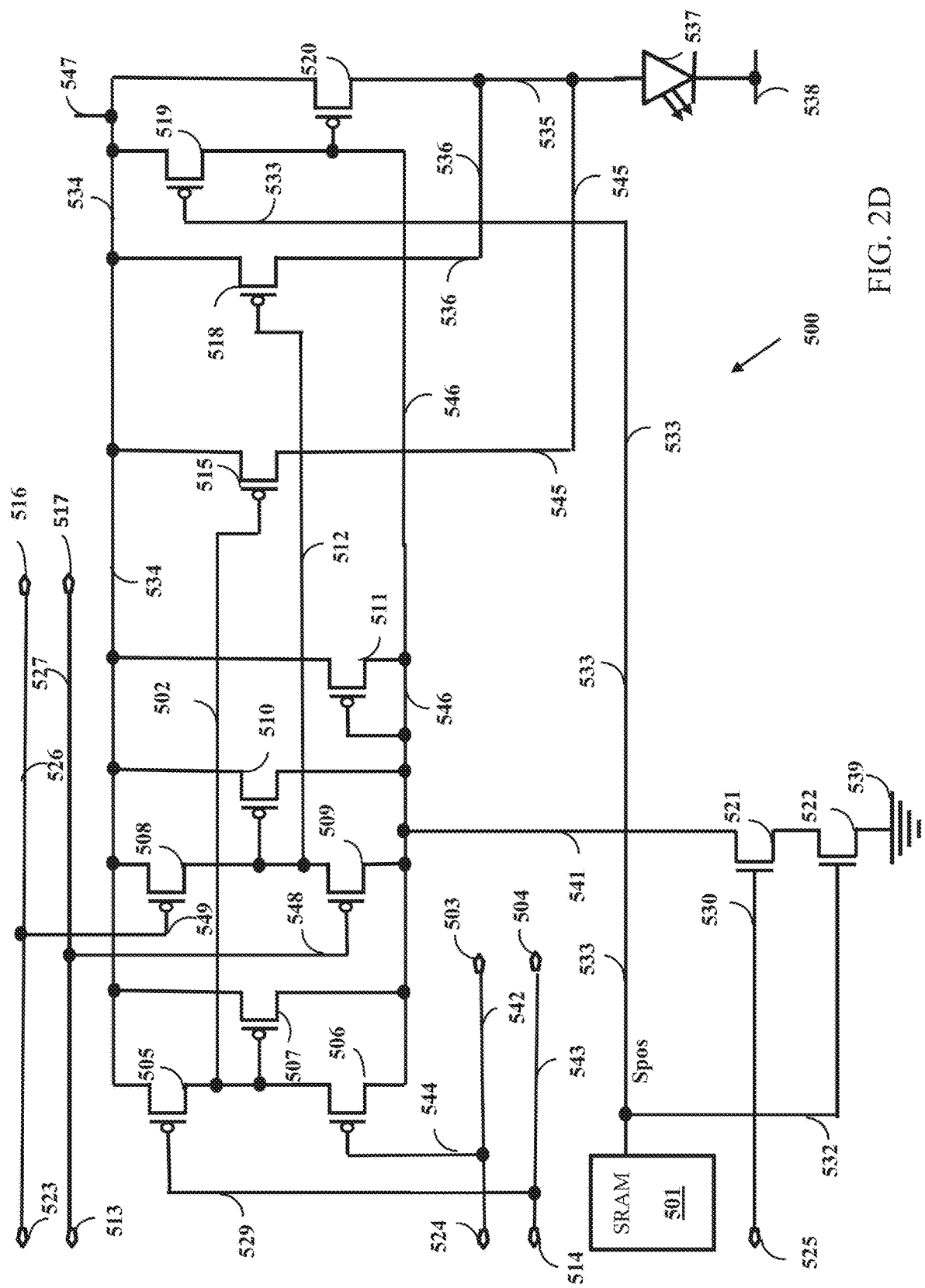
FIG. 2D presents a schematic circuit diagram of a simplified pixel drive circuit that provides a current to drive an emissive device with a pulse width modulated current.

An explanation is made with respect to FIGS. 2C and 2D regarding the actual current delivered to emissive element 212.

FIG. 2B shows a preferred embodiment of a storage element 250, also referred to as a memory cell. Storage element 250 is preferably a CMOS static ram (SRAM) latch device. Such devices are well known in the art. See DeWitt U. Ong, *Modern MOS Technology, Processes, Devices, & Design,* 1984, Chapter 9-5, the details of which are hereby fully incorporated herein by reference. A static RAM is one in which the data is retained as long as power is applied, though no clocks are running FIG. 1B shows the most common implementation of an SRAM cell in which six transistors are used. FET transistors 258, 259, 260, and 261 are n-channel transistors, while FET transistors 262, and 263 are p-channel transistors. In this particular design, word line WLINE 251, when held high, turns on pass transistors 258 and 259 by asserting the state of WLINE 251 onto the gate of pass transistor 258 over conductor 252 and onto the gate of pass transistor 259 over conductor 253, allowing ($B_{POS}$) 254, and ($B_{NEG}$) 255 lines to remain at a pre-charged high state or be discharged to a low state by the flip flop (i.e., transistors 262, 263, 260, and 261). The potential on $B_{POS}$ line 254 is asserted onto the source of pass transistor 258 over conductor 256, and the potential on $B_{NEG}$ line 255 is asserted onto the source of pass transistor 259 over conductor 257. The drain of pass transistor 258 is asserted onto the drains of transistors 260 and 262 and onto the gates of transistors 261 and 263 over conductor 268 while the drain of pass transistor 259 is asserted onto the drains of transistors 261 and 263 and onto the gates of transistors 260 and 262 over conductor 267. Differential sensing of the state of the flip-flop is then possible. In writing data into the selected cell, ($B_{POS}$) 254 and ($B_{NEG}$) 255 are forced high or low by additional write circuitry on the periphery of the array of pixel circuits. The side that goes to a low value is the one most effective in causing the flip-flop to change state. In the present application, output port 269 ($S_{POS}$) and complementary output port 269 ($S_{NEG}$) are required to relay to circuitry in the remainder of the pixel circuit whether the data state of the SRAM is in an "on" state or an "off" state. A first signal output in this case is $S_{NEG}$, asserted onto conductor 264, meaning that when the data state of storage element 250 is high or on, the output asserted onto conductor 264 is low. A second signal output is $S_{POS}$, asserted onto conductor 269, meaning that when the data state of storage element 250 is high, or on, the output asserted onto conductor 269 is high. As will be shown regarding FIG. 2C, $S_{POS}$ is asserted on the gate of a first p-channel, causing it to conduct when $S_{POS}$ is low, and $S_{NEG}$ is asserted onto the gate of a second p-channel FET, causing it to conduct when $S_{NEG}$ is low. Because $S_{POS}$ and $S_{NEG}$ cannot both be low at the same time, the two FETs can never conduct at the same time. Good use of this is made in the circuit of FIG. 2C, as will be shown. Since $S_{POS}$ and $S_{NEG}$ are complementary, either or both sides can be used to provide the data state of memory cell 250.

SRAM circuit 250 is connected to $V_{DDAR}$ by conductor 265 and to $V_{SS}$ by conductor 266. $V_{DDAR}$ denotes the $V_{DD}$ for the array. It is common practice to use lower voltage transistors for periphery circuits such as the I/O circuits and control logic of a backplane for a variety of reasons, including the reduction of EMI and the reduced circuit size that this makes possible.

The six-transistor SRAM cell is desirable in CMOS type design and manufacturing since it involves the least amount of detailed circuit design and process knowledge and is the safest with respect to noise and other effects that may be hard to estimate before silicon is available. In addition, current processes are dense enough to allow large static RAM arrays. These types of storage elements are therefore desirable in the design and manufacture of liquid crystal on silicon display devices as described herein. However, other types of static RAM cells are contemplated by the present invention, such as a four transistor RAM cell using a NOR gate, as well as using dynamic RAM cells rather than static RAM cells. The convention in looking at the outputs of an SRAM is to term the outputs as complementary signals $S_{POS}$ and $S_{NEG}$.

FIG. 2C presents a schematic diagram of a current mirror pixel drive element 300 for an emissive element of an array of emissive elements. The element description follows that given for the block diagram of pixel drive element 200 of FIG. 2A. Pixel drive element 300 comprises two separately selectable reference current circuits and one non-selectable reference current circuit, two selectable current source circuits and one non-selectable current source circuit, a bias FET, a memory cell with complementary outputs and switch FETs configured to pulse width modulate the current output of current mirror pixel drive element 300.

A first selectable reference current circuit comprises p-channel switch FETs 305 and 306 and p-channel reference current FET 307. P-channel switch FETs 305 and 306 form means by which a gate voltage for reference current FET 307 is selected from one of two possible voltages. The two voltages are V_H, asserted on bus 334 from an external supply over terminal 347 and $V_{REF}$, asserted on bus 346. The source of p-channel switch FET 305 is connected to bus 334, and the drain of switch FET 305 is connected to the source of switch FET 306 and to the gate of reference current FET 307. The drain of p-channel switch FET 306 is connected to bus 346, which asserts $V_{REF}$ on that drain.

Control over which of switch FETs 305 and 306 is set to conduct is determined by signal Config2 asserted on terminal 324, which biases conductor 343 to the level of signal Config2. Conductor 343 connects to conductor 329, which is connected to the gate of switch FET 305. Conductor 343 also connects to the input of inverter 303, which connects to the gate of switch FET 306 over conductor 344. Because the input to the gate of FET 305 is Config2 and the input to the gate of FET 306 is the inverse of Config2, only one of p-channel switch FET 305 and p-channel switch FET 306 can be placed in a conducting state. When Config2 is high, switch FET 305 is selected off and switch FET 306 is selected on. Because in this mode the gate of reference current FET 307 is connected to $V_{REF}$ on bus 346 through switch FET 306 and the drain of reference current FET 307 is directly connected to $V_{REF}$ on bus 346, reference current FET 307 is placed in diode mode and is operative to generate a current onto bus 346. When Config2 is low, switch FET 305 is selected on and switch FET 306 is selected off. This asserts V_H on the gate of reference current FET 307, which already has V_H on its source. This action takes current source FET 307 out of saturation and no reference current issues from the drain of reference current FET 307.

Config2 also determines the state of a selectable current source assembly comprising p-channel switch FETs 313 and 314 and p-channel current source FET 315. As with the preceding example, the source of switch FET 313 is connected to V_H on bus 334, and the drain of switch FET 313 is connected to the source of switch FET 314 and to the gate of current source FET 315. The drain of switch FET 314 is connected to $V_{REF}$ on bus 328. The source of current source FET 315 is connected to V_H over bus 334. The drain of current source FET 315 is connected to the drains of current source FETs 318 and 320 and to the anode of LED 337 over conductor 335.

Control over which of switch FETs 313 and 314 is set to conduct is determined by signal Config2 asserted on terminal 324, which biases conductor 343 to the level of signal Config2. Conductor 343 connects to conductor 329, which is connected to the gate of switch FET 313. Conductor 343 also connects to the input of inverter 303, which connects to the gate of switch FET 314 over conductor 342. Because the input to the gate of FET 313 is Config2 and the input to the gate of switch FET 314 is the inverse of Config2, only one of p-channel switch FET 313 and p-channel switch FET 314 can be placed in a conducting state. When Config2 is high, switch FET 313 is selected off and switch FET 314 is selected on. Because in this mode the gate of current source FET 315 is connected to $V_{REF}$ on bus 346 through switch FET 314, and the drain of current source FET 315 is connected to the anode of LED 337 over conductor 345, which connects to conductor 335, current source FET 315 will provide current to drive LED 337. When Config2 is low, switch FET 313 is selected on and switch FET 314 is selected off. This asserts V_H on the gate of current source FET 315, which already has V_H on its source. This action takes current source FET 315 out of saturation and no current issues from the drain of current source FET 315 onto conductor 336.

Taking the previous description of the current source assembly comprising switch FETs 305 and 306 and current source FET 307 and the previous description of the current source assembly comprising switch FETs 313 and 314 and current source FET 315, these two assemblies operate in unison since both are controlled in a similar manner by signal Config2.

A second selectable reference current circuit comprises p-channel switch FETs 308 and 309 and p-channel reference current FET 310. P-channel switch FETs 308 and 309 form means by which a gate voltage for reference current FET 310 is selected from one of two possible voltages. The two voltages are V_H, asserted on bus 334 and $V_{REF}$, asserted on bus 346. The source of p-channel switch FET 308 is connected to bus 334, and the drain of p-channel switch FET 308 is connected to the source of switch FET 309 and to the gate of reference current FET 310. The drain of p-channel switch FET 309 is connected to bus 346, which asserts $V_{REF}$ on that drain.

Control over which of switch FETs 308 and 309 is set to conduct is determined by signal Config1 asserted on terminal 323, which biases conductor 326 to the level of signal Config1. Conductor 326 connects to the gate of switch FET 308 over conductor 349. Conductor 326 also connects to the input of inverter 302, which connects to the gate of switch FET 309 over conductor 327 and conductor 348. Because the input to the gate of FET 308 is Config1 and the input to the gate of FET 309 is the inverse of Config1, only one of p-channel switch FET 308 and p-channel switch FET 309 can be placed in a conducting state. When Config1 is high, switch FET 308 is selected off and switch FET 309 is selected on. Because in this mode the gate of current source FET 310 is connected to $V_{REF}$ on bus 346 through switch FET 309 and the drain of current source FET 310 is directly connected to $V_{REF}$ on bus 346, current source FET 310 is placed in diode mode and is operative to deliver a current onto bus 346. When Config1 is low, switch FET 308 is selected on and switch FET 309 is selected off. This asserts V_H on the gate of current source FET 310, which already has V_H on its source. This action takes current source FET 310 out of saturation and no current issues from the drain of current source FET 310.

Config1 also determines the state of a selectable current source circuit comprising p-channel switch FETs 316 and 317 and p-channel current source FET 318. As with the preceding example, the source of switch FET 316 is connected to V_H on bus 334, and the drain of switch FET 316 is connected to the source of switch FET 317 and to the gate of current source FET 318. The drain of switch FET 317 is connected to $V_{REF}$ on bus 328. The source of current source FET 318 is connected to V_H over bus 334. The drain of current source FET 318 is connected to the drain of current source FET 315 over conductors 336, 335 and 345 and to the drain of current source 320 and to the anode of LED 337 over conductors 336 and 335.

Control over which of switch FETs 316 and 317 is set to conduct is determined by signal Config1 asserted on terminal 323, which biases bus 326 to the level of signal Config1. Bus 326 connects to the gate of switch FET 316. Conductor 326 also connects to the input of inverter 302, which connects to the gate of switch FET 317 over conductor 327. Because the input to the gate of switch FET 316 is Config1 and the input to the gate of switch FET 317 is the inverse of Config1, only one of p-channel switch FET 316 and p-channel switch FET 317 can be placed in a conducting state. When Config1 is high, switch FET 316 is selected off and switch FET 317 is selected on. Because in this mode the gate of current source FET 318 is connected to $V_{REF}$ on bus 346 through switch FET 317, and the drain of current source FET 318 is connected to the anode of LED 337 over conductor 336, which connects to conductor 335, current source FET 318 will provide current to drive LED 337. When Config1 is low, switch FET 316 is selected on and switch FET 317 is selected off. This asserts V_H on the gate of current source FET 318, which already has V_H on its source. This action takes current source FET 318 out of saturation and no current issues from the drain of current source FET 318 onto conductor 336.

Taking the previous description of the current source assembly comprising switch FETs 308 and 309 and current source FET 310 and the previous description of the current source assembly comprising switch FETs 316 and 317 and current source FET 318, these two assemblies operate in unison—on or off—since both are controlled in a similar manner by signal Config1.

Signals Config1 and Config2 operate in a similar manner but can be operated independently of each other, A choice of how to operate Config1 and Config2 can be determined within control logic of the system, as previously noted for control system 180 of FIG. 1B.

Non-selectable reference current FET 311 is configured as a classic reference current component of a current mirror circuit. The source of reference current FET 311 is connected to V_H over bus 334. The gate and drain of reference current FET 311 are both connected to $V_{REF}$ over bus 346, placing reference current FET 311 in diode mode. The drain of reference current FET 311 always asserts its output over bus 346.

Non-selectable current source FET 320 is configured as a classic current source component of a current mirror circuit. The source of current source FET 320 is connected to V_H over bus 334. The gate of current source FET 320 is connected to $V_{REF}$ over bus 328. The drain of current source FET 320 is connected to the drain of current source FET 315 and to the drain of current source FET 318.

Since reference current FETs 307, 310 and 311 are identical and are connected in parallel and since current source FETs 315, 318 and 320 are identical and are connected in parallel, the net current the current mirror circuit provides should not change substantially regardless of whether or not Config1 or Config2 are selected high or low. Because all of the FETs are nominally identical, when the two optional FETs are selected in through the Config signal, the effective width of the three reference current FETs effectively become three times the width of a single reference current FET and the effective width of the three current source FETs becomes three times the width of a single current source FET. The main exception to the current rule would occur if there is a significant mismatch within the reference current circuits or the current source circuits.

A last requirement for a current mirror circuit is the provision of a reference voltage to bias the current to a required voltage needed to insure that LED 337 is driven to emit light when current is present on its anode. Large L n-channel bias FET 321 provides the required bias voltage to pixel drive element 300. The gate of large L n-channel bias FET 321 functions as a voltage controlled resistor, when operated in saturation, that receives on its gate a global or semi-global voltage $V_{BIAS}$ asserted from an external source on connection point 325 over conductor 330. The source of bias FET 321 is connected to the drain of n-channel switch FET 322, which, when configured to conduct, connects ground ($V_{SS}$) from its source onto the source of bias FET 321. The operation of switch FET 322 is explained in conjunction with the data modulation of pixel drive element 300. The drain of bias FET 321 is connected over conductor 341 to bus 346, which biases bus 346 to $V_{REF}$. Bias voltage $V_{BIAS}$ is connected from bus 346 onto bus 328 by p-channel switch FET 312 when switch FET 312 is set to conduct by a low signal on its gate. The operation of switch FET 312 is explained in conjunction with the data modulation of pixel drive element 300.

Pixel drive element 300 includes features enabling its modulation by the data state of a memory device forming a part of pixel drive element 300. SRAM memory element 301 is a dual output memory device, preferably a 6 transistor (6T) device such as SRAM circuit 250 of FIG. 2B. The complementary outputs of memory element 301 comprise $S_{POS}$ asserted on conductor 333 and $S_{NEG}$ asserted on conductor 331. As complementary outputs, when $S_{POS}$ is high, $S_{NEG}$ is necessarily low, and vice versa. Conductor 333 asserts $S_{POS}$ directly on the gate of modulation FET 319. Conductor 331 asserts $S_{NEG}$ directly on the gate of switch FET 312, which is operative to connect bus 346 to bus 328.

The operation of modulation FET 319 and switch FET 312 are coordinated such that only one at a time is closed. The operation of both FETs 319 and 312 in this manner is important to effective modulation of pixel drive element 300. When $S_{POS}$ is high, the gate of modulation FET 319 is high and modulation FET 319 does not conduct. When $S_{POS}$ is high, $S_{NEG}$ is low and, responsive to the low signal on its gate, switch FET 312 conducts, connecting bus 346 to bus 328. This asserts $V_{REF}$ onto bus 328, thereby asserting $V_{REF}$ on the gate of selectable current source FET 315 or selectable current source FET 318 or both, if selected on, and to the gate of non-selectable current source FET 320. In this condition, at least some current is provided to LED 337. When $S_{POS}$ is low and $S_{NEG}$ is high, switch 312 does not conduct, thereby separating bus 346 from bus 328. In this condition, the conditions for a current mirror circuit are not met, and no current is delivered to LED 337. Additionally, modulation FET 319 is set to conduct, thereby connecting bus 328 to voltage V_H found on bus 334. This drains any residual potential found on bus 328, thereby assuring a clean transition of LED 337 from a radiating state to a non-radiating state.

The cathode of LED 337 is connected to V_L over conductor 338. In one embodiment, V_L is a semi-global voltage with a different V_L possible for LEDs of different colors. In one embodiment, voltage V_L is provided in a common cathode configuration wherein all cathodes of LEDs are connected together. In one embodiment, V_L is equal to $V_{SS}$.

Signal $S_{NEG}$ asserted on conductor 331 also is asserted onto the input of inverter 304 over conductor 332. When $S_{NEG}$ is low, the input to inverter 304 is low and the output of inverter 304 asserted onto the gate of n-channel switch FET 322 is high. This places n-channel switch FET 322 in a conducting state, thereby connecting ground 339 ($V_{SS}$) to the source of large L n-channel bias FET 321. This allows bias FET 321 to set voltage $V_{REF}$ onto bus 346 over conductor 341. When $S_{NEG}$ is high, the output of inverted 304 asserted onto the gate of switch FET 322 is low. This places n-channel switch FET in a non-conduct state which breaks the connection from ground 339 to the source of large L n-channel bias FET 321. Now no voltage is present on bus 346. As previously noted, this condition also breaks the connection between bus 346 and bus 328 and connects bus 328 to V_H, so that no radiation takes place.

The use of inverter 304 attached to $S_{NEG}$ conductor 331 to invert $S_{NEG}$ to a signal identical to $S_{POS}$ is preferable to a direct connection to $S_{POS}$ conductor 333 because it provides isolation and prevents the high current loads associated with switch FET 339 from pulling on $S_{POS}$ conductor 333.

The purpose of using switch FET 322 to remove bias from bus 346 is primarily to reduce any residual heating due to the presence of voltage on bias FET 321. It is understood that this may also create some data dependent fluctuations in the intensity of light emitted by LED 337. For display applications, the source of bias FET 321 can be connected directly to ground 339 and switch FET 322 and inverter 304 can both be eliminated.

FIG. 2D presents a schematic diagram of a simplified version of current mirror pixel drive element 300 of FIG. 2C with a reduced number of transistors for an emissive element of an array of emissive elements. Simplifications over FIG. 2C comprise the elimination of one inverter, relocation of two inverters to the periphery of the array where they can serve a number of separate pixel drive circuits, and the elimination of two multiplexer circuits and the elimination of one switch FET. Pixel drive element 500 comprises two separately selectable reference current circuits and one non-selectable reference current circuit, two selectable current source circuits and one non-selectable current source circuit, a bias FET, a memory cell with complementary outputs and a modulation FET configured to pulse width modulate the current output of current mirror pixel drive element 500.

Config1 and Config2 are selection signals used to introduce additional circuits into the current mirror pixel drive circuit of FIG. 2D. Selection signal Config1 is asserted onto conductor 526 over terminal 523. The other end of conductor 526 terminates at terminal 516, which connects to terminal 523 of an adjacent pixel drive circuit. The complement of selection signal Config1 is asserted onto conductor 527 over terminal 513. The other end of conductor 527 terminates at terminal 517, which connects to terminal 513 of an adjacent pixel drive circuit. Selection signal Config2 is asserted onto conductor 543 over terminal 514. The other end of conductor 543 terminates at terminal 504, which connects to a terminal 514 of an adjacent pixel drive circuit. The complement of selection signal Config2 is asserted onto conductor 542 over terminal 524. The other end of conductor 542 terminates at terminal 503, which connects to a terminal 524 of an adjacent pixel drive circuit.

The signals for Config1 and its complement and for Config2 and its complement may be generated at the periphery of the overall array of pixel drive circuits. This reduces the number of FETs in the pixel drive circuit at the price of requiring f97r continuous connections for the configuration signals across the array rather than two.

A first selectable reference current circuit comprises p-channel switch FETs 505 and 506 and p-channel reference current FET 507. P-channel switch FETs 505 and 506 form a multiplexer by which a gate voltage for reference current FET 507 is selected from one of two possible voltages. The two voltages are V_H, asserted on bus 534 from an external supply over terminal 547 and $V_{REF}$, asserted on bus 546. The source of p-channel switch FET 505 is connected to bus 534, and the drain of switch FET 505 is connected to the source of switch FET 506 and to the gate of reference current FET 507. The drain of p-channel switch FET 506 is connected to bus 546, which asserts $V_{REF}$ on that drain. The source of FET 506, the drain of FET 505 and the gate of FET 507 are all connected by conductor 502 to the gate of FET 515.

Control over which of multiplexer FETs 505 and 506 is set to conduct is determined by signal Config2. Signal Config2 is asserted on terminal 514, which biases conductor 543 to the level of signal Config2. The complement of signal Config2 is asserted over terminal 524, which biases conductor 542 to the complement of signal Config2. Conductor 543 connects to conductor 529, which is connected to the gate of switch FET 505, thereby asserting Config2 on that gate. Conductor 542 connects to conductor 544, which connects to the gate of switch FET 506, thereby biasing that gate to the complement of Config2. Because the input to the gate of FET 505 is Config2 and the input to the gate of FET 506 is the complement of Config2, only one of p-channel switch FET 505 and p-channel switch FET 506 can be placed in a conducting state. When Config2 is high, switch FET 505 is selected off and switch FET 506 is selected on. Because in this mode the gate of reference current FET 507 is connected to $V_{REF}$ on bus 546 through switch FET 506 and the drain of reference current FET 307 is directly connected to $V_{REF}$ on bus 546, reference current FET 507 is placed in diode mode and is operative to generate a current onto bus 546. When Config2 is low, switch FET 505 is selected on and switch FET 506 is selected off. This asserts V_H on the gate of reference current FET 507, which already has V_H on its source. This action takes current source FET 507 out of saturation and no reference current issues from the drain of reference current FET 507.

Config2 also determines the state of a selectable current source assembly comprising p-channel current source FET 515. Because the gate and drain of reference current FET 507 are connected to the gate of current mirror FET 515, and because the source of reference current FET 507 and the source of current mirror FET 515 are connected over conductor 502 to V_H, these FETs are operative to operate as a current mirror circuit when switch FET 506 is set to conduct. When switch FET 505 is set to conduct, the source and gate of reference current FET 507 and current source FET 515 are set to the same voltage and Taking the previous description of the current source assembly comprising switch FETs 505 and 506 and current source FET 507 and the previous description of the current source assembly comprising current source FET 515, these two assemblies operate in unison since both are controlled by signal Config2 and the multiplexer comprising switch FETs 505 and 506.

A second selectable reference current circuit comprises p-channel switch FETs 508 and 509 and p-channel reference current FET 510. P-channel switch FETs 508 and 509 form a multiplexer by which a gate voltage for reference current FET 510 is selected from one of two possible voltages. The two voltages are V_H, asserted on bus 534 and $V_{REF}$, asserted on bus 546. The source of p-channel switch FET 508 is connected to bus 534, and the drain of p-channel switch FET 508 is connected to the source of switch FET 509 and to the gate of reference current FET 510. The drain of p-channel switch FET 509 is connected to bus 546, which asserts $V_{REF}$ on that drain. The drain of FET 508, the source of FET 509 and the gate of reference current FET 510 are all connected to the drain of current source FET 518 over conductor 512.

Control over which of multiplexer switch FETs 508 and 509 is set to conduct is determined by signal Config1 asserted on terminal 523, which biases conductor 526 to the level of signal Config1 and by the complement of signal Config1 asserted on terminal 513, which biases conductor 527 to the level of the complement of signal Config1. Conductor 526 connects to the gate of switch FET 508 over conductor 549. Conductor 527 connects to the gate of switch FET 509 over conductor 548. Because the input to the gate of FET 508 is Config1 and the input to the gate of FET 509 is the complement of Config1, only one of p-channel switch FET 508 and p-channel switch FET 509 can be placed in a conducting state. When Config1 is high, switch FET 508 is selected off and switch FET 509 is selected on. Because in this mode the gate of current source FET 510 is connected to $V_{REF}$ on bus 546 through switch FET 509 and the drain of current source FET 510 is directly connected to $V_{REF}$ on bus 346, current source FET 510 is placed in diode mode and is operative to deliver a current onto bus 346. When Config1 is low, switch FET 508 is selected on and switch FET 509 is selected off. This asserts V_H on the gate of current source FET 310, which already has V_H on its source. This action takes current source FET 510 out of saturation and no current issues from the drain of current source FET 510.

Config1 also determines the state of a selectable current source circuit comprising p-channel current source FET 318. As with the example of Config2, the gate of reference current FET 510 is connected to the gate of current source FET 318. Because the select state of reference current FET 310 and current source FET 318 are determined by the voltage on the gate of each one, the two FETs are always in the same state, whether selected or non-selected. The source of reference current FET 510 and the source of current source FET 518 are connected to V_H over bus 534. The drain of current source FET 518 is connected to the drains of current source FETs 515 and 520 and to the anode of LED 537 over conductor 535.

Because the gate of reference current FET 510 is connected to the gate of current source FET 518 and because the sources of reference current FET 510 and current source FET 515 are both connected to V_H, when reference current FET 510 is operated in diode mode, then current source 518 mirrors the current of reference current FET 510, thus forming a current mirror circuit together.

Because reference current FET 510 and current mirror FET 518 share the output of the multiplexer comprising switch FET 508 and switch FET 509, when reference current FET 510 is in diode mode, current source FET 518 is configured to mirror the current asserted on its gate.

Signals Config1 and Config2 operate in a similar manner but can be operated independently of each other. A choice of how to operate Config1 and Config2 can be determined within control logic of the system, as previously noted for control system 180 of FIG. 1B.

Non-selectable reference current FET 511 is configured as a classic reference current component of a current mirror circuit. The source of reference current FET 511 is connected to V_H over bus 534. The gate and drain of reference current FET 511 are both connected to $V_{REF}$ over bus 546, placing reference current FET 511 in diode mode. The drain of reference current FET 511 always asserts its output over bus 546.

Non-selectable current source FET 520 is configured as a classic current source component of a current mirror circuit. The source of current source FET 520 is connected to V_H over bus 534. The gate of current source FET 320 is connected to $V_{REF}$ over bus 546. The drain of current source FET 520 is connected to the drain of current source FET 515 and to the drain of current source FET 518.

Since reference current FETs 507, 510 and 511 are identical and are connected in parallel and since current source FETs 515, 518 and 520 are identical and are connected in parallel, the net current the current mirror circuit provides should not change substantially regardless of whether or not Config1 or Config2 are selected high or low. Because all of the FETs are nominally identical, when the two optional FETs are selected in through the Config signal, the effective width of the three reference current FETs effectively become three times the width of a single reference current FET and the effective width of the three current source FETs becomes three times the width of a single current source FET. The main exception to the current rule would occur if there is a significant mismatch within the reference current circuits or the current source circuits.

A last requirement for a current mirror circuit is the provision of a reference voltage to bias the current to a required voltage needed to insure that LED 537 is driven to emit light when current is present on its anode. Large L n-channel bias FET 521 provides the required bias voltage to pixel drive element 300. The gate of large L n-channel bias FET 521 functions as a voltage controlled resistor, when operated in saturation, that receives on its gate a global or semi-global voltage $V_{BIAS}$ asserted from an external source on connection point 525 over conductor 530. The source of bias FET 521 is connected to the drain of n-channel switch FET 522, which, when configured to conduct, connects ground ($V_{SS}$) (ground 539) from its source onto the source of bias FET 521. The operation of switch FET 522 is explained in conjunction with the data modulation of pixel drive element 500. The drain of bias FET 521 is connected over conductor 541 to bus 546, which biases bus 546 to $V_{REF}$.

Pixel drive element 500 includes features enabling its modulation by the data state of a memory device forming a part of pixel drive element 500. SRAM memory element 501 is a dual output memory device, preferably a 6 transistor (6T) device such as SRAM circuit 250 of FIG. 2B. The complementary outputs of memory element 501 comprise $S_{POS}$ asserted on conductor 533 and $S_{NEG}$ which is not asserted on a conductor in this implementation.

The operation of modulation FET 519 and n-channel switch FET 522 are coordinated such that only one at a time is closed. The operation of both FETs 519 and 522 in this manner is important to effective modulation of pixel drive element 500. When $S_{POS}$ is high, the gate of modulation FET 519 is high and modulation FET 519 does not conduct. When $S_{POS}$ is high and, responsive to the high signal on its gate, switch FET 522 conducts, connecting large L n-channel FET to $V_{SS}$ at ground 539. This asserts $V_{REF}$ onto bus 546, thereby asserting $V_{REF}$ on the gate of selectable current source FET 515 or selectable current source FET 518 or both, if selected on, and to the gate of non-selectable current source FET 520. In this condition, at least some current is provided to LED 537. In this mode, modulation FET 519 does not conduct and LED 537 radiates or discharges light.

When modulation FET 519 is set to conduct, thereby connecting bus 546 to voltage V_H found on bus 534, this drains any residual potential found on bus 546, thereby assuring a clean transition of LED 537 from a radiating state to a non-radiating state. Switch FET 522 disconnects large L n-channel FET 521 from $V_{SS}$, thus preventing a direct short between V_H and $V_{SS}$.

The cathode of LED 537 is connected to V_L over conductor 538. In one embodiment, V_L is a semi-global voltage with a different V_L possible for LEDs of different colors. In one embodiment, voltage V_L is provided in a common cathode configuration wherein all cathodes of LEDs are connected together. In one embodiment, V_L is equal to $V_{SS}$.

Signal $S_{POS}$ asserted on conductor 532 is asserted thereby onto the gate of n-channel switch FET 522. When $S_{POS}$ is high, this places n-channel switch FET 522 in a conducting state, thereby connecting ground 539 ($V_{SS}$) to the source of large L n-channel bias FET 521. This allows bias FET 521 to set voltage $V_{REF}$ onto bus 546 over conductor 541. When signal $S_{POS}$ is low, this places n-channel switch FET 522 in a non-conduct state which breaks the connection from ground 539 to the source of large L n-channel bias FET 521. Now no voltage is asserted on bus 546. As previously noted, this condition also places modulation FET 519 in a mode to conduct which insures that no current is discharged.

The purpose of using switch FET 522 to remove bias from bus 546 is primarily to reduce any residual heating due to the presence of voltage on bias FET 521. In this circuit, it is also necessary to insure that no short exists across modulation FET 519 through large L n-channel FET 521 to $V_{SS}$.

Figure 2E:
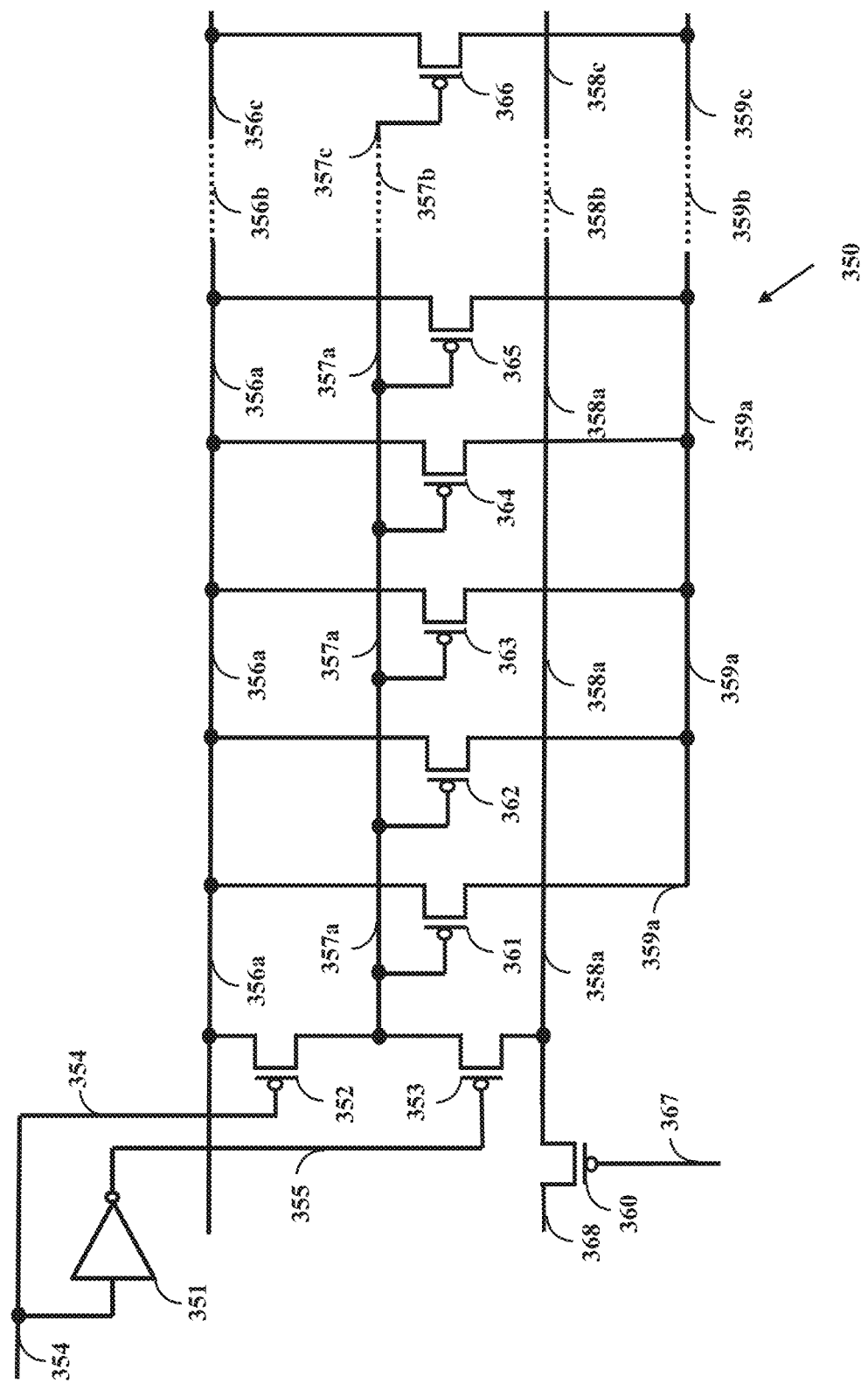
FIG. 2E presents a schematic circuit diagram of elements of an emissive driver circuit that provides a heavily mirrored current source.

FIG. 2E depicts a single selectable current source circuit segment 350 similar to the previously noted example of pixel drive element 300 of FIG. 2C. Current mirror circuit segment 350 comprises a single pair of p-channel switch FETs 352 and 353 placed in series to form a multiplexer circuit, a plurality of current source FETs 361 through 366, $V_{REF}$ bus segments 358a, 358b and 358c, V_H bus segments 356a, 356b and 356c, and switch FETs 352 and 353 output bus segments 357a, 357b and 357c. A reference current FET similar to reference current FET 310 of current mirror pixel drive element 300 of FIG. 2C is also required and would operate responsive to Config1 in a manner similar to that previously described with respect to pixel drive circuit 300 of FIG. 2C. In one embodiment, the current source FETs are number 1 through n, wherein n is a positive integer in the approximate range of 20 to 50.

Configuration signal Config1 is asserted onto conductor 354 which is connected to the gate of p-channel switch FET 352 and onto the input of inverter 351. The output of inverter 351 is asserted onto the gate of p-channel switch FET 353 over conductor 355. When Config1 is low, then switch FET 352 is placed in an on state and switch FET 353 is placed in an off state, which connects V_H onto output bus segments 357a, 357b and 357c, thereby asserting V_H onto the gates of current source FETs 361 through 366. This effectively takes current source FETs 361 through 366 out of saturation and insures that no current is asserted onto the drains of current source FETs 361 through 366.

When Config1 is high, then switch FET 352 is placed in an off state and switch FET 353 is placed in an on state, which connects $V_{REF}$ onto output bus segments 357a, 357b and 357c, thereby asserting $V_{REF}$ onto the gates of current source FETs 361 through 366. Since the sources of current source FETs 361 through 366 are connected to V_H bus segments, 356a, 356b and 356c, current source FETs 361 through 366 now replicate the current asserted on their gates. The drains of current source FETs 361 through 366 now assert the replicated current onto current bus segments 359a, 359b and 359c.

$V_{REF}$ is received from another $V_{REF}$ bus on terminal 368. Switch FET 360 receives a signal $S_{NEG}$ from an SRAM memory cell (not shown) forming another part of the pixel drive element over terminal 367. When $S_{NEG}$ is low, switch FET 360 asserts $V_{REF}$ onto $V_{REF}$ bus segments 358a, 358b and 358c.

In summary, circuit 350 is a multiple current source analog to the selectable current source circuit formed by switch FETs 313 and 313 and current source FET 315 of current mirror circuit 300 in FIG. 2C. The same consideration applies to the selectable current source circuit formed by switch FETs 316 and 317 and current source FET 318 of current mirror circuit 300 in FIG. 2C.

In one embodiment, current source circuit is formed as non-selectable by removing connections 354 and 355, removing FET 352 and inverter 351 and replacing switch FET 353 with a conductor directly connecting bus 357a to $V_{REF}$ bus 358a. In this manner, modified circuit 350 becomes a direct counterpart to always on current source FET 320 of current mirror circuit 300 in FIG. 2C.

The number of current source FETs forming a circuit such as current mirror segment 350 depends on the total current desired for each pixel drive element. In normal practice, the W and L dimensions of each reference current FET are duplicated in each current source FET. When more current is needed than the current source FET provides, the W dimension of the current source FET can be enlarged. In practice, a FET of width dimension 2 W and length dimension L is equivalent to two FETs in parallel, each of width dimension W and length dimension L. This permits a significant level of design efficiency improvement because the reference current FET and the current source FETs are duplicates of each other. In present invention, up to 30 current source FETs are envisioned for each reference current FET.

Other dimensional considerations are also important. Any of the forgoing FETs identified as switch FETs may be designed using minimum dimensions practical for the required voltage and current of the process. At very high current levels, reference current and current source FETs must be designed with care. While large L devices can be used up to certain levels of current, at some undetermined point it becomes advantageous to use shorter L devices to avoid the heat buildup that accompanies large L devices. In the present invention, the dimensions of the reference current and current source FETs is envisioned to be 30% to 50% greater than the minimum dimensions mentioned above. In one embodiment, the current reference FETs may have a W/L ratio on the order of 15:1 with the L dimension set at approximately twice the minimum dimension.

Calculation of the average or effective threshold voltage of a circuit with multiple current sources in parallel is a root-mean-square calculation rather than the arithmetic mean. The calculation is only a rough estimate because of all the process variables that may be present in an array of current source FETs belonging to a single pixel drive circuit. The applicable RMS formula without weighting of the individual terms follows.

$Xrms = \sqrt{\Sigma_{i=1}^{i=n} Xi^2/n}$ where i=1 to n, n being the number of parallel current source FETs and Xi being the threshold voltages of the individual parallel current source FETs.

FIGS. 3A, 3B, 3C and 3D present an exploration of the relationship between a logical circuit, its schematic circuit and its physical implementation.

Figure 3A:
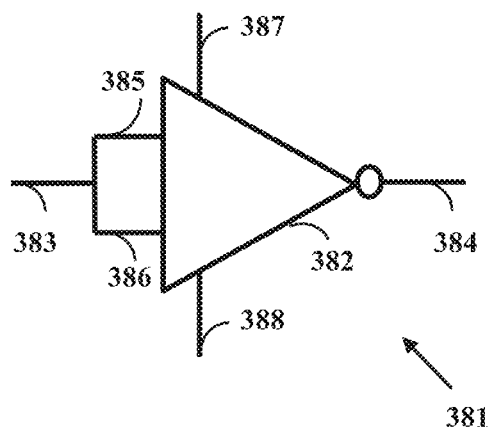
FIG. 3A presents a logical diagram of an inverter circuit.

FIG. 3A presents a logical drawing 381 of a simple CMOS inverter circuit 38s. CMOS inverter 382 comprises terminal 387 over which a voltage, such a $V_{DD}$, is asserted onto inverter 382 and terminal 388 over which a voltage, such as $V_{SS}$, is asserted onto inverter 382. The main requirement is that the voltage asserted on terminal 387 must be greater than the voltage asserted on terminal 388 by a certain level determined by the specifics of design. An input voltage to inverter 382 is asserted over conductor 383 onto input terminals 385 and 386, and an output voltage equal to one of the voltages asserted on terminal 387 and 388 is asserted onto output terminal 384.

In a simple implementation, the voltage asserted onto conductor 383 is one of the voltages asserted onto terminal 387 and terminal 388. If the voltage asserted onto conductor 387 is $V_{DD}$ and the voltage asserted onto conductor 388 is $V_{SS}$, then if the voltage asserted onto conductor 383 is $V_{DD}$, then the output asserted onto output terminal 384 will be $V_{SS}$. In like manner, if the voltage asserted onto conductor 383 is $V_{SS}$, then the output asserted onto terminal 384 will be $V_{DD}$. This is the origin of the term inverter.

Of course, the voltage asserted onto conductor 383 need not be $V_{DD}$ or $V_{SS}$, just as the voltage asserted onto terminal 387 need not be $V_{DD}$ and the voltage asserted on terminal 388 need not be $V_{SS}$ as long as the earlier restriction is maintained.

Figure 3B:
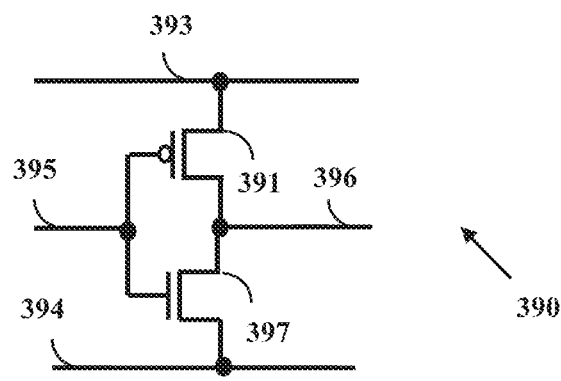
FIG. 3B presents a schematic circuit diagram of a CMOS inverter circuit.

FIG. 3B presents a schematic circuit diagram 390 of a simple CMOS inverter such as logical drawing 381 of FIG. 3A. Schematic diagram 390 comprises p-channel FET 391 and n-channel FET 397 configured with the source of p-channel FET 391 connected to $V_{DD}$ over conductor 393 and the source of n-channel FET 397 connected to $V_{SS}$ over conductor 394. The input signal is connected over conductor 395 to the gate of p-channel FET 391 and to the gate of n-channel FET 397. The drains of p-channel FET 391 and n-channel FET 397 are connected to each other and to output conductor 396.

When the input signal asserted over conductor 395 is low, nominally $V_{SS}$, the signal asserted on the gate of p-channel FET 391 is low and the signal asserted on the gate of n-channel FET 397 is low. This effectively shuts off n-channel FET 397, which does not conduct, and causes p-channel FET 391 to conduct, thereby asserting $V_{DD}$ found on its source onto its drain and thereby onto output conductor 396.

When the input signal asserted over conductor 395 is high, nominally $V_{DD}$, the signal asserted on the gate of p-channel FET 391 is high, effectively shutting it off, and the signal asserted on the gate of n-channel FET 397 is high, effectively turning it on. In this case, the voltage $V_{SS}$ found on its source is effectively asserted on its drain and thereby onto output conductor 395. Thus the actions attributable to schematic circuit diagram 390 are identical to those of the presumptive model 381 of FIG. 3A.

Figure 3C:
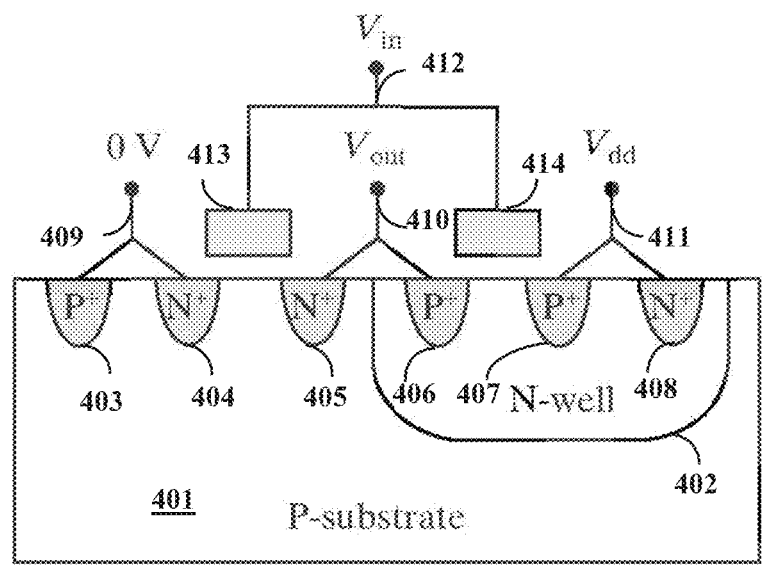
FIG. 3C presents a side view of the physical structure of a CMOS inverter circuit.
Figure 3D:
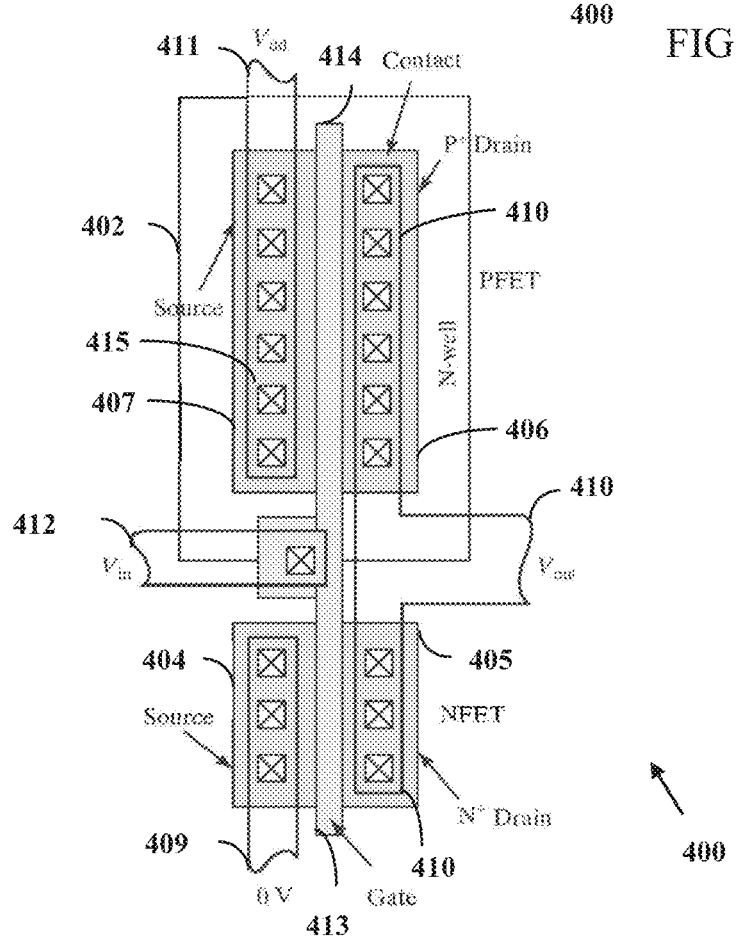
FIG. 3D presents an overhead view of the physical structure of a CMOS inverter circuit.

FIGS. 3C and 3D depict side and overhead views of a physical implementation 400 of inverter schematic circuit diagram 390 when realized in a typical CMOS substrate. FIGS. 3C and 3D are based on FIG. 6-7b and FIG. 6-7c of *Modern Semiconductor Device for Integrated Circuits*, Chenming Hu, pp. 217-218 (print version), pp 199-200 (online version), Pearson Education, New Jersey, 2010, hereafter CHENMING HU. Applicant notes that the side view of FIG. 3C is not precisely a side view of the planar view of FIG. 3D. Nevertheless, the primary features are present in both and the difference does not distract from the exposition of the relationship between the primary features.

Side view and top view of physical implementation 400 in FIG. 3C and FIG. 3D comprise p-substrate 401, n-well 402, p-substrate bias implant 403, n-well bias implant 408, a p-channel FET comprising source 407, gate 414 and drain 406, and an n-channel FET comprising source 404, gate 413 and drain 405. Drain 405 of the n-channel FET and drain 406 of the p-channel FET are tied together and form an output at terminal 410.

$V_{SS}$ (0 volts) is asserted over terminal 409 onto p-substrate bias implant 403 and onto n-channel FET source 404. $V_{DD}$ is asserted over terminal 411 onto n-well bias implant and onto p-channel FET source 407. Gate 413 of the n-channel FET is tied to gate 414 of the p-channel FET at input terminal 412, which serves as the point where the input voltage of physical implementation 403 is asserted.

The behavior of inverter physical implementation 400 presented in FIGS. 3C and 3D will necessarily replicate the behavior of schematic 390 of FIG. 3B since the primary components are present and are interconnected in identical fashions.

FIG. 3D is particularly important because it reveals something of the relative planar size, topology and interconnect technology of a typical CMOS layout design. While inherently not to scale, the drawing does call attention to several known characteristics that must be taken into account.

The first is that vias are all normally of the same size. This permits all vias associated with a given layer to be fabricated through the same mask, which is a design efficiency improvement. Not shown is the use of silicidation with a silicide material such as $liSi_2$ to improve conductivity around the source, gate and drain of a FET. In some instances more than one via may be needed, although silicidation may reduce the total number of vias required.

Reviewing FIG. 3D, applicant calls attention to the relative size of the p-channel FET formed in n-well 402 and the n-channel FET formed at the bottom of the drawing. P-substrate 401 is not depicted but lies under all depicted components of FIG. 3D as is clear from FIG. 3C. The p-channel FET in n-well 402 is depicted as roughly twice the size of n-channel FET below, as evidenced by six vias 415 (one indicated) above to three below. This is an artifact of the relative weakness of p-channel FETs to n-channel FETs. In order to compensate for this, the p-channel FET is made larger. A common rule of thumb not well attested to is that the length of the channel of a p-channel FET for a circuit of this type is in the range of 1.7 to 3 times the length of the channel of an n-channel FET.

There is a body of work within the semiconductor design literature devoted to the need to match properties of CMOS transistors. One early paper, *Matching Properties of MOS Transistors*, Pelgrom, et al, IEEE Journal of Solid-State Circuits, Vol. 24, No. 5, pp. 1411-1440, October 1989 (hereafter PELGROM), is often cited as authoritative, although subsequent authors have taken issue with a number of the conclusions of PELGROM, especially as applied to submicron processes now common rather than the 2.25 micron process of PELGROM. See, for example, *A Comprehensive MOSFET Mismatch Model*, Drennan et al, IEEE International Electronic Device Meeting, pp. 167-170, December 1999 (hereafter DRENNAN) which calls attention to a number of points that the authors find inadequate or incorrect in PELGROM. The authors seek to improve on PELGROM through additional experimentation coupled with modeling and conclude that the 1/WL mismatch model of PELGROM can be improved on by various variations of 1/WL, comprising $1/L^2$, $1/WL^2$, $1/W^2$, and $1/LW^2$, selected according to the individual component of mismatch.

A short list of process parameters that affect important performance measures such as threshold voltage $V_T$ is found in *Digital Integrated Circuits—A Design Perspective*, RABAEY et al, Pearson, Pearson Education, page 122, 2002. Variation in threshold voltage $V_T$ may be attributed to differences in oxide thickness, substrate, polysilicon and implant impurity levels and the surface charge. Similarly, variation in transconductance V' is primarily influenced by oxide thickness with secondary influence from electron mobility.

One important aspect of FET performance is the bias voltage applied to the substrate or well in which the FET is placed. The present examples are based on a p-substrate with n-wells formed thereon. The p-substrate is normally biased to $V_{SS}$ and the n-wells are normally biased to $V_{DD}$. P-channel FETs are placed in n-wells and n-channel FETs are placed in p-substrates, although a p-well may be used when the wafer is an n-substrate.

In the examples of FIGS. 2C and 2D, the number of p-channel pixels occupying a pixel drive circuit are on the order of 125 while the number of n-channel FETs occupying a pixel driver circuit is approximately 10. Ninety of the p-channel FETs are large W FETs with an aspect ratio of W over L in the range of 15:1 to 20:1. One of the n-channel FETs is a very large L n-channel FET used to for the reference voltage for the current mirror circuits. Based on the above numbers, the area that must be formed into an n-well is will likely need to be significantly larger than the area for p-substrate within each pixel.

The implication of this is that the physical layout of the pixel circuit must be carefully considered to insure that as many p-channel FETs are placed in the same n-well as possible. The benefits of this include the fact that having a similar bias in a common well on a collection of approximately similar field effect transistors will reduce the possibility that at least one variable that cause differences in the threshold voltage $V_T$ of the approximately similar transistors. Approximately similar in this case indicates that a group of transistors are in the same layer in the same portion of the substrate or the same portion of a well and have approximately the same physical W and L dimensions and approximately the same effective W and L dimensions.

One important design consideration for both wells and substrates is the recognized need to provide bias as equally as possible across the entire well or substrate. It is especially important to avoid resistive pats along the contacts. One accepted means for accomplishing this is to provide numerous contacts between the supply voltage bus and the substrate or well. The voltage level to which a well or substrate is biased has bearing on the effective threshold voltage and on-state response time of FETs located within that well or substrate. For the current invention, the bias level for a p-substrate is nominally $V_{SS}$ and the bias level for an n-well is nominally $V_{DD}$ or $V_{DDAR}$ ($V_{DD}$ for the array.) Other schemes may be preferred in different circumstances. There are no forward or reverse biases involved and $V_T$ is unmodified.

It is also desirable to match the source to gate voltages $V_{GS}$ of the current source FETs of an individual pixel drive circuit. The voltage on the source of a current source FET is in a path that must carry considerable current when operated in an on state, while the voltage on the gate of a current source FET is mainly used to control the resistive state of the current source FET that enables the FET to act as a current source, which requires only negligible current flow. As a result, it is useful that the source voltage is supplied over a metal conductor, such as aluminum, while the gate voltage may be supplied over a material of higher resistance, such as polysilicon.

Figure 4A:
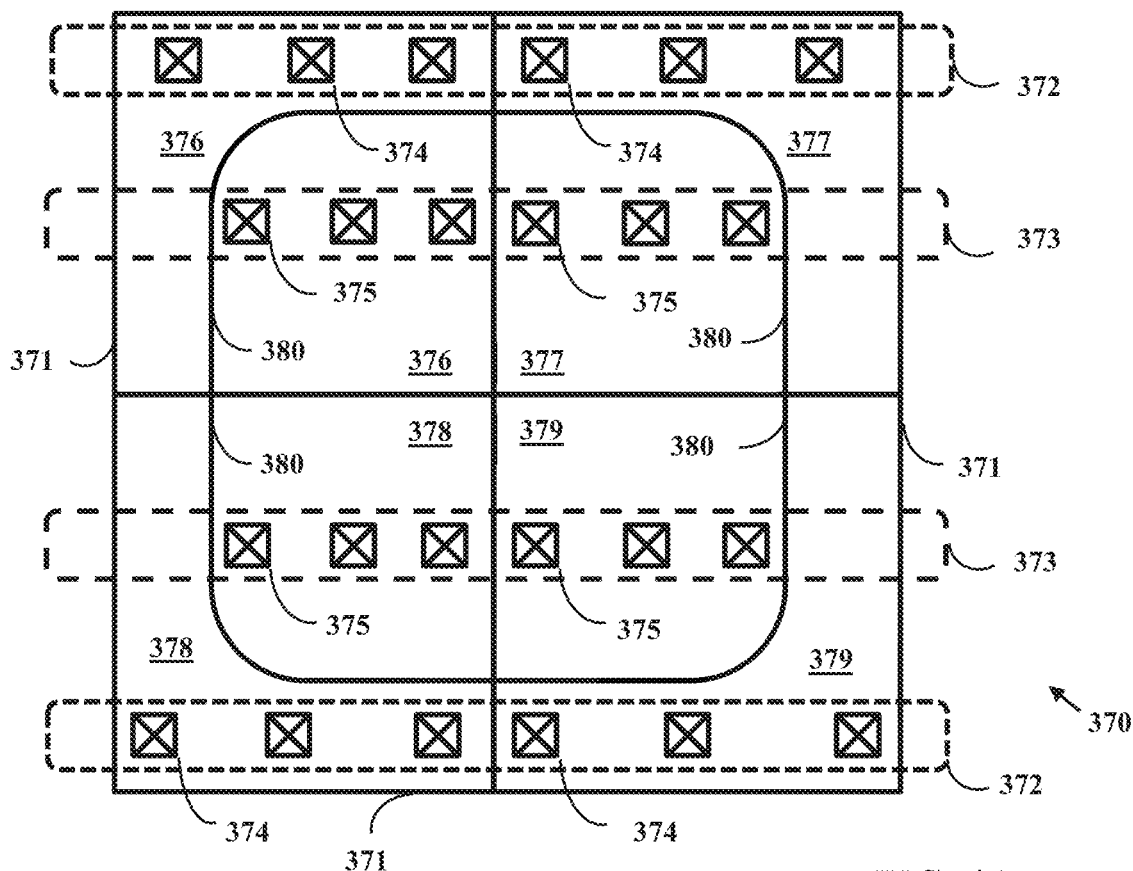
FIG. 4A presents an overhead view of elements of a CMOS substrate/well structure spanning four driver pixels.

FIG. 4A depicts an assemblage of pixel drive circuits 370 comprising four pixel circuit outlines 376, 377, 378 and 379 sharing common n-well 380 formed on p-substrate 371. Using pixel circuit 376 as base, pixel circuit 377 is the mirror of pixel circuit 376 about a vertical axis; pixel circuit 378 is the mirror of pixel circuit 376 about a horizontal axis, and pixel circuit 379 is the mirror of pixel circuit 377 about a horizontal axis, which is equivalent to being a mirror of pixel circuit 378 about a vertical axis. Use of such mirroring is common in two dimensional circuit design, which may be applied at different levels.

Assemblage of pixel drive circuits 370 further comprises a plurality of $V_{SS}$ buses 372 and a plurality of $V_{DDAR}$ buses 373. $V_{SS}$ buses 372 each connect to p-substrate 371 through a plurality of contacts 374. One of three contacts 374 is depicted in each of pixel 376, 377, 378 and 379. The plurality of contacts assures a lower resistance contact structure and a more even distribution of voltage $V_{SS}$ in the substrate. $V_{DDAR}$ buses 373 each connect to n-well 380 through a plurality of contacts 375. One of three contacts 375 is depicted in each of pixel 376, 377, 378 and 379. The plurality of contacts assures a lower resistance contact structure and a more even distribution of voltage $V_{DDAR}$ in the substrate. The use of silicidation with materials such as $TiSi_2$ may reduce the number of vias required to lower the resistance to an adequate level.

Figure 4B:
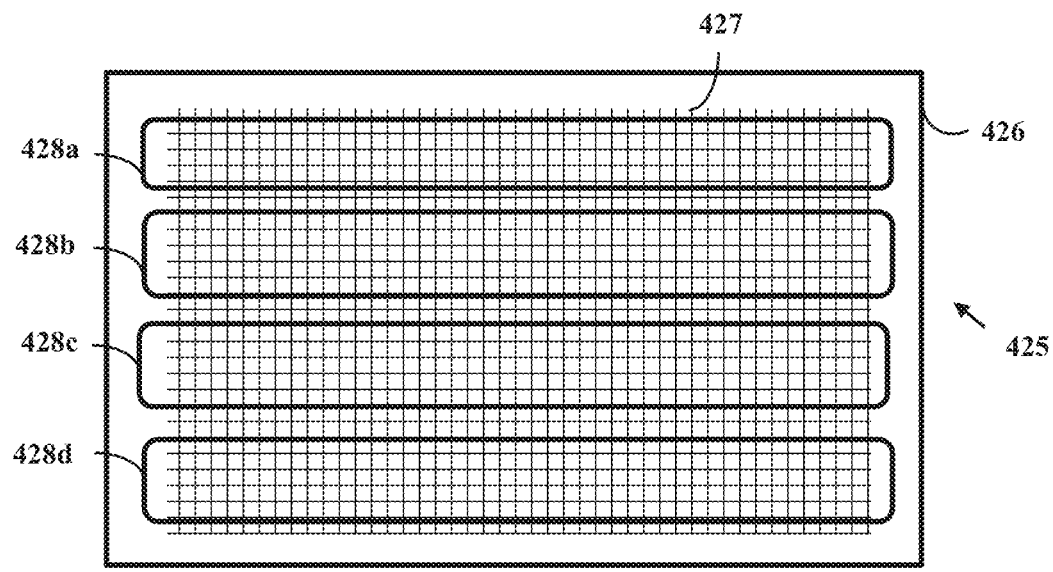
FIG. 4B presents an overhead view of a CMOS substrate/well structure spanning the entire width of an array of emissive elements.

FIG. 4B depicts semiconductor backplane 425 comprising p-substrate 426, n-wells 428a, 428b, 428c and 428d, and array of pixel drive circuits 427. N-wells 428a, 428b, 428c and 428d extend across the entire width of array of pixel drive circuits 427. The vertical size of the n-wells is substantially exaggerated to ensure clarity. Each of n-wells 428a, 428b, 428c and 428d are connected to $V_{DDAR}$ over a series of buses (not shown) with a plurality of contacts (not shown) as described for assemblage 370 of FIG. 4A. The horizontal ends of n-well 428a, 428b, 428c and 428d extend beyond the edges of array of pixel circuits 427 in order to minimize any edge effects that may occur near the ends of an n-well due to the projection nature of photomasks used to print integrated circuits.

Figure 4C:
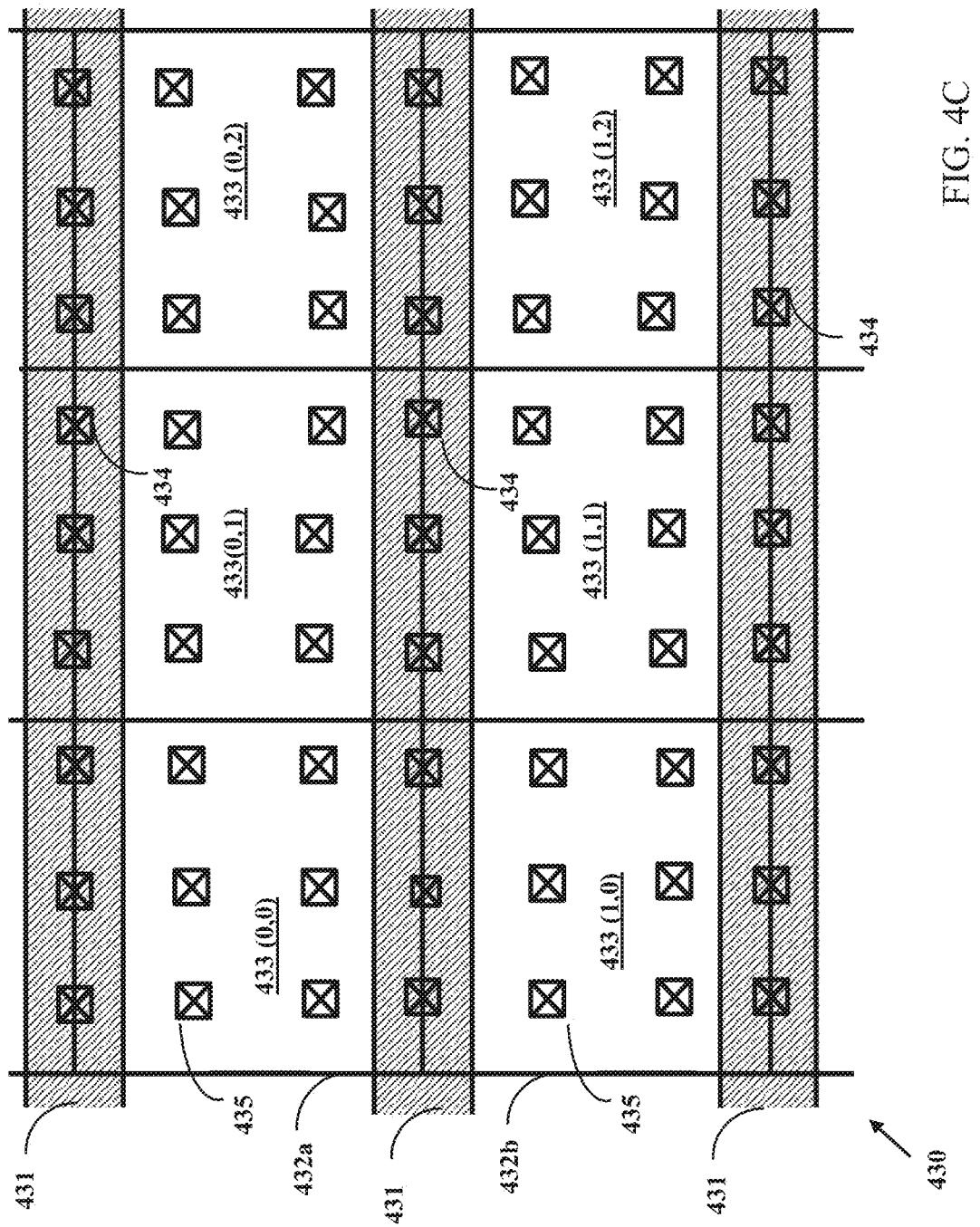
FIG. 4C presents a detailed overhead view of a 2×3 pixel section of a CMOS substrate/well structure spanning the entire width of an array of emissive elements.

FIG. 4C presents an expanded section 430 after backplane 425 of FIG. 4B. Expanded section 430 comprises p-substrate 431, displayed in three sections, n-well 432a and *n*-well 432b. N-well 432a and *n*-well 432b represent small segments of n-wells that span the entire width of an array of pixel drive elements after n-wells 428a, 428b, 428c and 428d of FIG. 4B. N-wells 432a and 432b are formed separately but using substantially identical process steps on p-substrate 431. N-well 432a and *n*-well 432b are each connected to a bus (not shown) biased to $V_{DDAR}$ over a plurality of contacts 435 (two of 36 indicated.) P-substrate 431 connects to a bus (not shown) biased to $V_{SS}$ over a plurality of contacts 434 (3 of 27 indicated.)

Expanded section 430 comprises an array of pixel drive circuits two rows high and three columns wide. Row 0 (zero) comprises pixel drive circuits 433 (0,0), 433 (0,1), and 433 (0,2), which share n-well 432a. Row 1 comprises pixel drive circuits 433 (1,0), 433 (1,1), and 433 (1,2), which share n-well 432b.

Column 0 (zero) comprises pixel drive circuits 433 (0,0) and 433 (1,0); column 1 comprises pixel drive circuits 433 (0,1) and 433 (1,1); and column 2 comprises pixel drive circuits 433 (0,2) and 433 (1,2). Each pixel drive circuit of each column occupies an n-well not shared with other pixel drive circuits of the same column.

The issue remains one of process variance. Placing two or more substantially identically designed FETs in a common n-well will in general tend to cause those FETs to exhibit similar performance. The example of FIG. 4A presents a way of providing a common n-well to four adjacent pixel drive circuits forming a 2 by 2 array. The examples of FIGS. 4B and 4C provides a second way of providing a common n-well to a linear array of pixel drive circuits. Both approaches afford an opportunity to match the threshold voltages of a number of FETs that are designed to have substantially the same physical configuration.

Figure 4D:
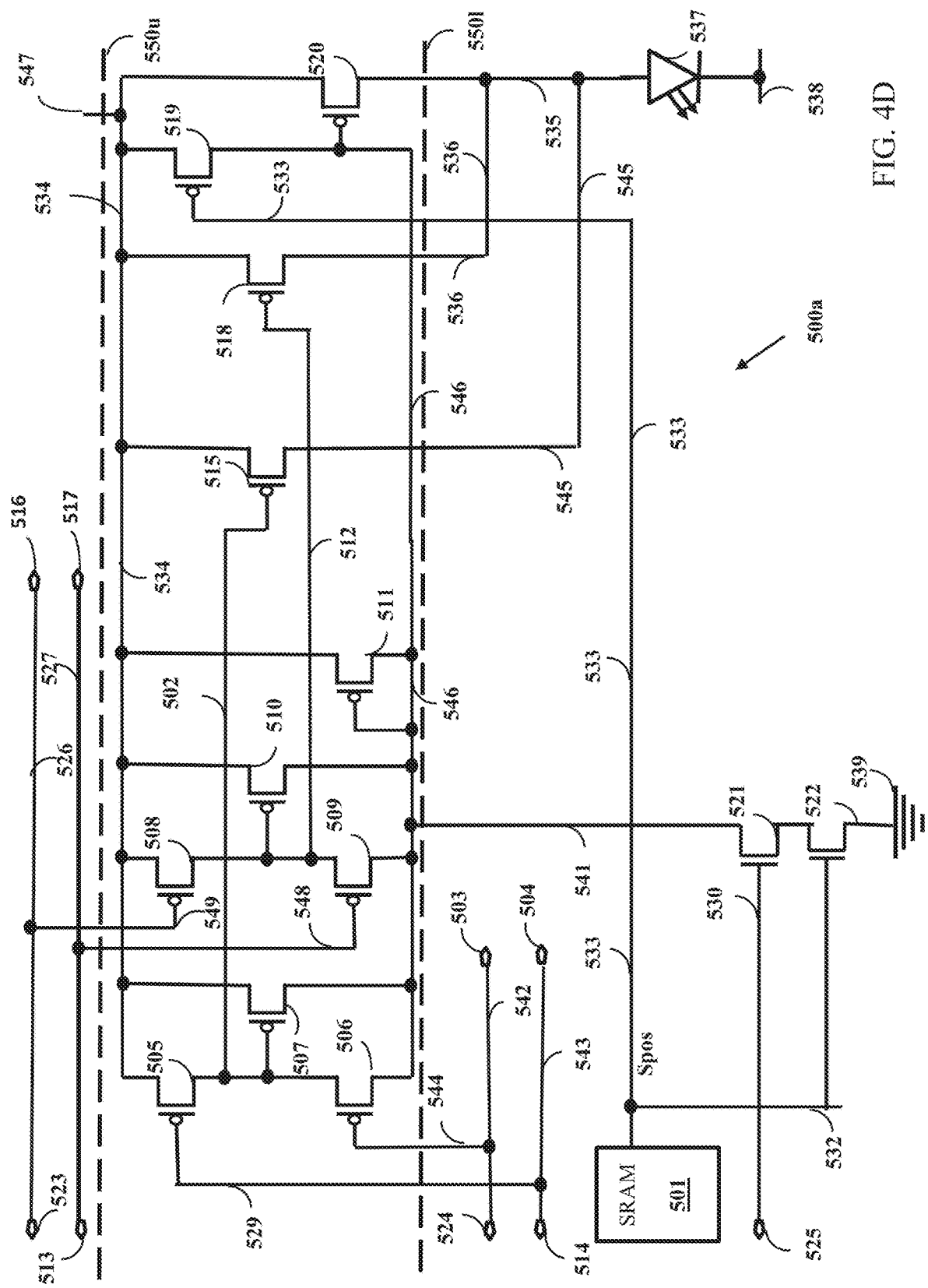
FIG. 4D presents a hybrid view of a series of p-channel FETs formed in an n-well wherein groups of the FETs should be threshold matched.

FIG. 4D depicts a hybrid illustration of a single pixel drive circuit 500a substantially identical to the pixel drive circuit 500 of FIG. 2D. Two dashed lines 550u and 550l have been added to indicate the upper limit 550u and the lower limit 550l of an n-well of the type previously described. The side to side bounds of the n-well are not defined for this example. All FETs between upper limit 550u and lower limit 550l are p-channel FETs that would need to be created in an n-well placed on a p-substrate in a CMOS process.

One aspect in common to all the previously described n-well variations is a need to insure that the n-well is biased to a common voltage. A conductor of the lowest available resistance extending along substantially all of the n-well can be used together with multiple attachment points to the bus supplying the bias voltage to insure that the n-well has a substantially identical bias voltage at all points.

There are other approaches that can result in a reduction in the effects of threshold voltage variance across a group of parallel current source FETs. In many applications, a large L n-channel FET is operated as a voltage selectable resistor in which the voltage applied to the gate of the large L n-channel FET. There is a linear current range between the threshold voltage $V_T$ of the large L n-channel FET and the voltage $V_{DSAT}$ at which the current output $I_D$ becomes saturated. This is also known as the triode range in some texts. It is a common practice to confine operation of a large L n-channel FET to this linear range through the selection of $V_{BIAS}$, but it can also be operated in saturation provided the current available there satisfies the overall design requirements. $V_{DSAT}$ is also variously defined, with some sources stating that it is the point at which the current curve bends over and other stating that it is the point at which the current curve reaches 90% of its peak value. Either is acceptable.

There is an advantage that accrues in being able to operate a large L n-channel bias FET in saturation. A similar advantage may accrue to p-channel FETs or n-channel FETs of more conventional dimensions.

Figure 5A:
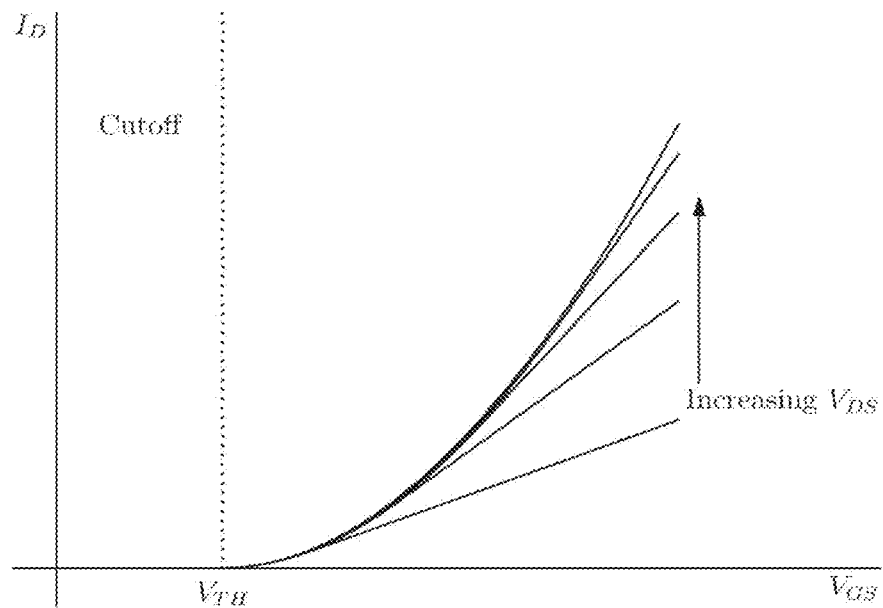
FIGS. 5A and 5B present graphs of the voltage performance of an n-channel FET over its cutoff, triode and saturation ranges.

FIG. 5A presents a plot of the current output $I_D$ of an n-channel FET as a function of the gate to source voltage $V_{GS}$. In the region marked cutoff the voltage is below the threshold voltage required for current to flow through the FET, defined as $V_{GS}<V_{TH}$. The family of curves to the right of the vertical line at $V_{TH}$ represent the voltages in the linear or triode range.

Figure 5B:
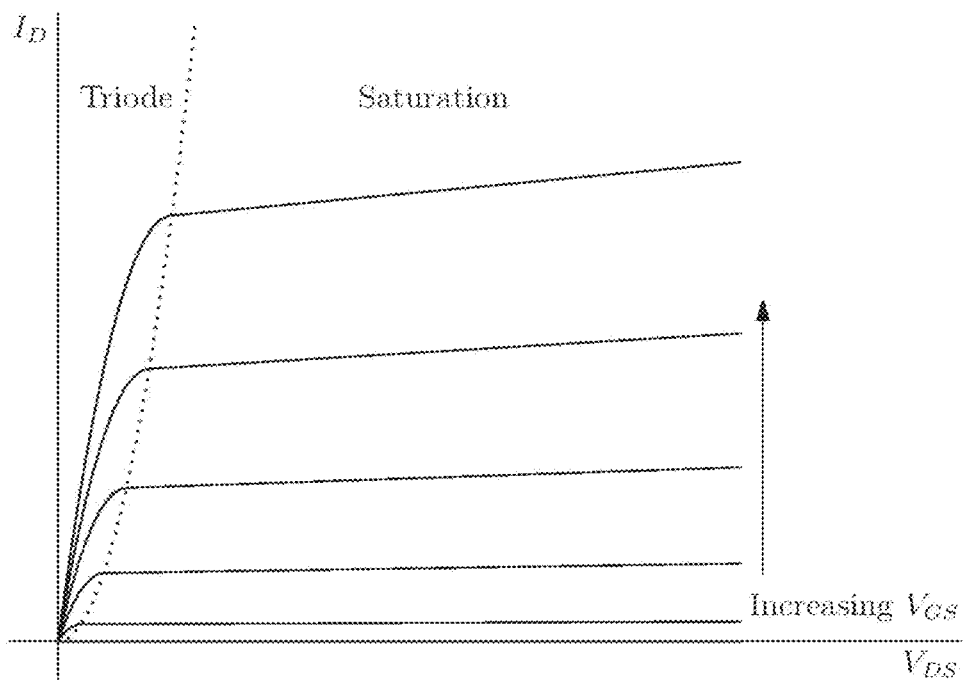

FIG. 5B presents a plot of the output current $I_D$ of an n-channel FET as a function of the drain to source voltage $V_{DS}$. No threshold region is shown because $V_{DS}=0$ until $V_{DS} \geq V_{TH}$. The triode or linear region lies to the left of the dotted line representing the transition point from the linear region to the saturation region and the region to the right of the dotted line is the saturation region. The point at which the curve transitions from linear to saturation is the saturation voltage of $V_{DS}$ or $V_{DSAT}$.

The greatest concern for parallel current sources is variance in the threshold voltage $V_T$ across the range of parallel devices These occur even under the best of circumstances, although the steps taken to minimize the effect will somewhat effective in controlling the variance. Nevertheless, once the device is manufactured in silicon, the variance is fixed and other steps must be considered to decrease the relevance of the variance.

The equation for $I_D$ as a function of gate to source voltage and threshold voltage follows:

$$I_D = \frac{1}{2}\mu_n C_{ox} \frac{W}{L}(V_{GS} - V_{TH})^2$$

Where $\mu_n$ represents the charge carrier effective mobility, $C_{ox}$ represents the gate oxide capacitance per unit area and W and L represent the effective width and length of the gate. The ratio of width to length is inversely proportional to the resistance of the gate, so doubling W reducing the resistance R by half. $V_{GS}$ and $V_{TH}$ are previously defined.

This equation is simplified for this example. The dominant variables in the equation are $V_{GS}$ and $V_{TH}$, and variations in $V_{TH}$ are the matter of concern. One analysis of the problem of variance in $V_{TH}$ relies on the value of $V_{GS}$ relative to $V_{TH}$. A way of expressing this is:

$I_D \propto ((V_{GS} - V_{TH})^2$, also presented as $\Delta V_{GS}^2$, where
$\Delta V_{GS} = V_{GS} - V_{TH}$ Which means that the current is proportional to the square of the difference between the gate to source voltage and the threshold voltage. The other variables are minor effects compared to this.

In the ensuing text, the n-channel FET will be assumed to be operating in saturation, as noted in FIG. 5B. The point at which VGS causes the FET to enter saturation is termed $V_{DS\_SAT}$ where $V_{DS} \geq V_{GS} - V_{TH}$ $V_{DS}$ is defined as the drain to source voltage. In this region the drain current of the n-channel FET is a weak function of the drain voltage in the operating region of interest. When operating with the condition $V_{DS} < V_{GS} - V_{TH}$ The drain current of the n-channel FET is a strong function of the drain to source voltage, and the FET is said to be operating in the triode or linear region. In this region, the n-channel FET operates as a voltage controlled diode. This application will concentrate on operation in saturation.

In order to operate the n-channel FET in saturation, the $V_{DS}$ drain to source voltage must always exceed the voltage where the FET transitions to the saturation region. If it is desired to operate in saturation at a voltage lower than the transition region, then the design of the n-channel FET has to be changed. Looking at the equation for drain current $$I_D = \frac{1}{2}\mu_n C_{ox} \frac{W}{L}(V_{GS} - V_{TH})^2$$

This can be rewritten as $$I_D = \frac{1}{2}\mu_n C_{ox} \frac{W}{L}(\Delta V_{GS})^2$$

as previously noted, which becomes $$I_D = \frac{1}{2}\mu_n C_{ox} \frac{W}{L}(V_{DS\_SAT})^2$$

at the point where the n-channel FET enters the saturation range.

Reordering the equation to solve for W/L, the equation now becomes $$\frac{W}{L} = I_D / (V_{DS_{SAT}}^2) \frac{1}{2}\mu_n C_{OX}$$

For the next step, an evaluation is made of the W/L formula at two different $V_{DS\_SAT}$ points, denoted as $V_{DS\_SAT1}$ and $V_{DS\_SAT\_2}$, where both are at the same $I_D$ current value. The individual ratios are denoted as $WL_{RATIO1}$ and $WL_{RATIO2}$ for $V_{DS\_SAT1}$ and $V_{DS\_SAT2}$ respectively. Taking the ratio $WL_{RATIO}$ of $WL_{RATIO1}$ and $WL_{RATIO2}$ yields $$WL_{RATIO} = \left(\frac{I_D}{\frac{1}{2}\mu_n C_{OX} V_{DS\_SAT1}^2}\right) / \left(\frac{I_D}{\frac{1}{2}\mu_n C_{OX} V_{DS\_SAT2}^2 1}\right)$$

Simplifying the equation by removing common factors and reordering the remaining factors yields $$WL_{RATIO} = \frac{V_{DS\_SAT2}^2}{V_{DS\_SAT1}^2} = \left(\frac{V_{DS\_SAT2}}{V_{DS\_SAT1}}\right)^2$$

Let $V_{DS\_SATR}$ equal the ratio of $V_{DS\_SAT2}$ divided by $V_{DS\_SAT1}$, then $WL_{RATIO} = V_{DS\_SATR}^2$ Going back to the definition of $WL_{RATIO}$, where $WL_{RATIO} = WL_{RATIO1}/WL_{RATIO2}$, it is possible now to solve for $WL_{RATIO2}$ as a function of $WL_{RATIO1}$ and $V_{DS\_SATR}$.

$WL_{RATIO2} = WL_{RATIO1}/V_{DS\_SATR}^2$

Analyzing the consequence of this reveals that if the goal is to reduce the required $V_{DS\_SAT2}$ voltage by a factor of 2 from $V_{DS\_SAT1}$, then the $WL_{RATIO2}$, the effective width of the FET, must be increased by a factor of 4 over $WL_{RATIO1}$. A calculation behind this follows.

$$WL_{RATIO2} = \frac{WL_{RATIO1}}{0.5^2} = 4WL_{RATIO1}$$

This establishes the possibility that sensitivity to $V_{TH}$ variations can be controlled by manipulating the W/L ratio.

As previously noted, the threshold voltages of FETs are somewhat variable even within elements of the same sub-circuit. The mechanisms include local gate oxide thickness, local implant concentrations, local device dimensional variations, local thermal effects and many other effects. These effects can cause variations in $V_T$ for similar FETs operating in current source circuits in an ensemble of current sources on the same silicon dice. Note that the W/L ratio of C1 may be achieved by 25 parallel 1/1 devices after condition C2 as well as by a single device of 25/1 W/L ratio.

The following text examines sensitivity to $V_T$ variations at two bias conditions C1 and C2.

| Condition → | C1 | C2 |
|---|---|---|
| $V_T$ | 0.8 v | 0.8 v |
| $V_{GS}$ | 1.0 v | 1.8 v |
| $\Delta V_{GS}$ | 0.2 v | 1.0 v |
| W/L | 25/1 | 1/1 |

-continued

| Condition → | C1 | C2 |
|---|---|---|
| Condition → | C1 | C2 |
| $V_{DS\,SAT}$ | 0.2 v | 1.0 v |
| $I_D$ | $(1/2)\mu_n C_{OX}$ | $1/2)\mu_n C_{OX}$ |

Use the baseline equation $I_D = \frac{1}{2}\mu_n C_{ox}\frac{W}{L}(V_{GS} - V_{TH})^2$ For condition C1, $I_D =$ $$\frac{1}{2}\mu_n C_{OX}\left(\frac{25}{1}\right)(1.0 - 0.8)^2 = \frac{1}{2}\mu_n C_{OX}25(0.2)(0.2) = \frac{1}{2}\mu_n C_{OX}$$

For condition C2, $I_D =$ $$\frac{1}{2}\mu_n C_{OX}\left(\frac{1}{1}\right)(1.8 - 0.8)^2 = \frac{1}{2}\mu_n C_{OX}1(1.0)(1.0) = \frac{1}{2}\mu_n C_{OX}$$

To differentiate the baseline equation above with respect to $V_{TH}$, first expand the term in parentheses.

$$I_D = \frac{1}{2}\mu_n C_{ox}\frac{W}{L}(V_{GS}^2 + V_{TH}^2 - 2V_{GD}V_{TH}),$$

and then modify the groupings $$I_D = \frac{1}{2}\mu_n C_{ox}\frac{W}{L}(V_{GS}^2) + \frac{1}{2}\mu_n C_{OX}\frac{W}{L}V_{TH}^2 - \frac{1}{2}\mu_n C_{OX}\frac{W}{L}2V_{GS}V_{TH},$$

again modifying the groupings $$I_D = \frac{1}{2}\mu_n C_{ox}\frac{W}{L}V_{GS}^2 + \frac{1}{2}\mu_n C_{OX}\frac{W}{L}(V_{TH}^2 - 2V_{GS}V_{TH}),$$

now differentiating with respect to $V_{TH}$.

$$\frac{dI_D}{dV_{TH}} = 0 + 2\left(\frac{1}{2}\mu_n C_{OX}\frac{W}{L}(V_{TH} - V_{GS})\right)$$

The first term does not contain $V_{TH}$ and differentiates to 0. The second term differentiates to a term comprising the difference between $V_{GS}$ and $V_{TH}$, which may be rewritten as $$\frac{dI_D}{dV_{TH}} = 2\left(\frac{1}{2}\mu_n C_{OX}\frac{W}{L}(-(V_{GD} - V_{TH}))\right),$$

which may alternatively be written as $$\frac{dI_D}{dV_{TH}} = 2\left(\frac{1}{2}\mu_n C_{OX}\frac{W}{L}(-\Delta V_{GS})\right)$$

Next the baseline equation is differentiated with respect to $V_{GS}$. Starting with the intermediate grouping from above.

$$I_D = \frac{1}{2}\mu_n C_{ox}\frac{W}{L}(V_{GS}^2) + \frac{1}{2}\mu_n C_{OX}\frac{W}{L}V_{TH}^2 - \frac{1}{2}\mu_n C_{OX}\frac{W}{L}2V_{GS}V_{TH},$$

which may be reordered as $$I_D = \frac{1}{2}\mu_n C_{ox}\frac{W}{L}(V_{GS}^2 - 2V_{GS}V_{TH}) + \frac{1}{2}\mu_n C_{OX}\frac{W}{L}V_{TH}^2.$$

Taking the differential with respect to $V_{GS}$ yields.

$$\frac{dI_D}{dV_{GS}} = 2\left(\frac{1}{2}\mu_n C_{OX}\frac{W}{L}(V_{GS} - V_{TH})\right) + 0,$$

which may also be written as $$\frac{dI_D}{dV_{GS}} = 2\left(\frac{1}{2}\mu_n C_{OX}\frac{W}{L}(\Delta V_{GS})\right)$$

By inspection, the two derived differentials are closely related, differing only in sign, as expected. The remainder of this exposition will concentrate on the differential of $I_D$ with respect to $V_{TH}$.

The previously presented table disclosing conditions C1 and C2 is repeated here for use as an example for analysis and evaluation. The constant $\frac{1}{2}\mu_n C_{OX}$ used in the above equations is replaced by the letter A to simplify the interpreting of the results. Note that this is also the drain current $I_D$ for this example. The revised equation follows.

$$\frac{dI_D}{dV_{GS}} = 2\left(A\frac{W}{L}(\Delta V_{GS})\right)$$

The completed table is presented below.

| Condition → | C1 | C2 |
|---|---|---|
| $V_T$ | 0.8 v | 0.8 v |
| $V_{GS}$ | 1.0 v | 1.8 v |
| $\Delta V_{GS}$ | 0.2 v | 1.0 v |
| W/L | 25/1 | 1/1 |
| Condition → | C1 | C2 |
| $V_{DS\,SAT}$ | 0.2 v | 1.0 v |
| $I_D$ | $(1/2)\mu_n C_{OX} = A$ | $(1/2)\mu_n C_{OX} = A$ |
| $\frac{dI_D}{dV_{TH}}$ | 10A | 2A |

The two conditions have identical outcomes. This is by design and is typical of a current mirror circuit wherein the ratio of reference current FET width dimension to current source FET width dimension is unchanged between different implementations.

The results indicate that when the number of parallel current sources is increased, the slope of the change with respect to threshold voltage $V_{TH}$ increases. Also note that the voltage range $\Delta V_{GS}$ is greater with fewer parallel current sources, which places the FET further in saturation. This indicates that a current source where uniformity with respect to threshold voltage is desired should use as few parallel devices as possible while achieving the desired current and voltage. By inspection it is obvious that intermediate W/L conditions will fall between the two differential condition results. Following previous statements, the intermediate W/L conditions may be achieved through the use of a multiple number of W/L dimensioned FETs identical to a 1/1 dimensioned FET linked in parallel. The number of parallel FETs is determined by current and voltage requirements, as each FET will ultimately have currency density limits.

Knowledge of this allows informed design decisions to be made. The tradeoff is to be made between a higher level of threshold voltage uniformity resulting from process variations that requires higher current density, which may adversely affect product lifetime in a number of ways, or a lower level of threshold voltages that requires lower current density, thereby improving the likely product lifetime. The product lifetime may be affected by the Joule effect (heating), electromigration effect (connection erosion resulting in a circuit break) and the slow diffusion effect (aging.) The choice of which is more important is a product design consideration and may require significant interaction between the design staff and the product staff. The present disclosure offers a path by which the consequences of this decision can be adjusted for electronically after the product is in prototyping, evaluation or production phases.

Those with experience of the art will recognize alternative implementations and variations that may be implemented using the disclosure of this invention. All are encompassed within the present disclosure.

What is claimed is:

1. An apparatus, comprising:
    a plurality of pixel drive circuits including a first pixel drive circuit and a second pixel drive circuit, the plurality of pixel drive circuits forming part of an array of emissive elements; and
    a first field effect transistor (FET) of the first pixel drive circuit in a first quadrant of a common well sharing the common well with a second FET in the second pixel drive circuit in a second quadrant of the common well such that a variance of a threshold voltage between the first FET and the second FET is substantially reduced,
    the first pixel drive circuit including a circuit configured to deliver a current at a predetermined voltage to an emissive device and a memory circuit configured to receive modulation data and to use the modulation data to modulate a current output of the first pixel drive circuit.

2. The apparatus of claim 1, wherein the common well is shared among a m columns by n rows of the plurality of pixel drive circuits, m comprising an integer greater than one and n comprising an integer equal to or greater than one.

3. The apparatus of claim 2, wherein a number of the n rows is greater than one.

4. The apparatus of claim 1, wherein the common well of the plurality of pixel drive circuits is included in a part of at least one row of the plurality of pixel drive circuits.

5. The apparatus of claim 4, wherein the common well occupies part of at least one row of the plurality of pixel drive circuits is included in a contiguous part of an adjacent row of the plurality of pixel drive circuits.

6. The apparatus of claim 1, wherein the common well is an n-well and the first FET located therein is a p-channel FET.

7. The apparatus of claim 1, wherein the common well is a p-well and the first FET located therein is an n-channel FET.

8. The apparatus of claim 1, wherein the common well is biased to a common supply voltage over a plurality of contacts.

9. An apparatus, comprising:
    a plurality of pixel drive circuits organized into sets of pixel drive circuits, each set pixel drive circuits including at least one pixel drive circuit, the plurality of pixel drive circuits defining part of an array of emissive elements and defining a plurality of rows and a plurality of columns; and
    a first field effect transistor (FET) of a set of pixel drive circuits sharing a common well with a second FET of similar function to the first FET in the set of pixel drive circuits, the first FET being in a first quadrant of the common well and the second FET being in a second well within the common well such that a variance of a threshold voltage of first FET and a threshold voltage of the second FET is substantially reduced,
    each of the set of pixel drive circuits including a circuit configured to deliver a current at a predetermined voltage to an emissive device and a memory circuit configured to receive modulation data and to modulate a current output of each of the set of pixel drive circuits,
    the common well being biased to a common supply voltage over a plurality of contacts aligned along a bus.

10. The apparatus of claim 9, wherein the common well is shared among a m columns by n rows of the set of pixel drive circuits where m is an integer greater than one and n is an integer equal to or greater than one.

11. The apparatus of claim 10, wherein a number of the n rows is greater than one.

12. The apparatus of claim 9, wherein the common well of each set of pixel drive circuits is included in a part of at least one row of the plurality of pixel drive circuits.

13. The apparatus of claim 12, wherein the common well occupies part of at least one row of the plurality of pixel drive circuits is included in a contiguous part of an adjacent row of the plurality of pixel drive circuits.

14. The apparatus of claim 9, wherein the common well is an n-well and the first FET located therein is a p-channel FET.

15. The apparatus of claim 9, wherein the common well is a p-well and the first FET located therein is an n-channel FET.

16. The apparatus of claim 9, wherein the common well is biased to a common supply voltage over a plurality of contacts.

17. An apparatus, comprising:
    a plurality of pixel drive circuits including a first pixel drive circuit and a second pixel drive circuit, the plurality of pixel drive circuits forming part of an array of emissive elements; and
    a first field effect transistor (FET) of the first pixel drive circuit in a first quadrant of a common well sharing the common well with a second FET in the second pixel drive circuit in a second quadrant of the common well such that the first pixel drive circuit is mirrored with the second pixel drive circuit across an axis, the first pixel drive circuit including a circuit configured to deliver a current at a predetermined voltage to an emissive device and a memory circuit configured to receive modulation data and to use the modulation data to modulate a current output of the first pixel drive circuit.

18. The apparatus of claim 17, wherein the common well is biased to a common supply voltage over a plurality of contacts.

\* \* \* \* \*